(12) United States Patent
You

(10) Patent No.: US 7,947,539 B2
(45) Date of Patent: May 24, 2011

(54) THIN FILM TRANSISTOR ARRAY PANEL FOR A DISPLAY DEVICE AND A METHOD OF MANUFACTURING THE SAME

(75) Inventor: Chun-Gi You, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/548,834

(22) Filed: Aug. 27, 2009

(65) Prior Publication Data

US 2009/0311814 A1 Dec. 17, 2009

Related U.S. Application Data

(62) Division of application No. 11/627,683, filed on Jan. 26, 2007, now abandoned.

(30) Foreign Application Priority Data

Apr. 24, 2006 (KR) .................. 10-2006-0036719

(51) Int. Cl.
*H01L 21/00* (2006.01)
(52) U.S. Cl. ................... 438/149; 257/E21.414
(58) Field of Classification Search ............. 438/149
See application file for complete search history.

(56) References Cited

U.S. PATENT DOCUMENTS

| | | | |
|---|---|---|---|
| 5,352,907 A | 10/1994 | Matsuda et al. | |
| 5,874,326 A | 2/1999 | Lyu | |
| 6,107,640 A | 8/2000 | Park et al. | |
| 6,166,400 A | 12/2000 | Chang et al. | |
| 6,399,428 B2 | 6/2002 | Nakahori et al. | |
| 6,597,415 B2 | 7/2003 | Rho et al. | |
| 7,115,906 B2 | 10/2006 | Lai | |
| 2004/0036816 A1 | 2/2004 | Yun | |

(Continued)

FOREIGN PATENT DOCUMENTS

CN 1632675 6/2005

(Continued)

OTHER PUBLICATIONS

English abstract of KR 1020040070979 for related application KR10-0522436, Apr. 30, 1998.

*Primary Examiner* — Thao X Le
*Assistant Examiner* — Kimberly Trice
(74) *Attorney, Agent, or Firm* — F. Chau & Associates, LLC

(57) ABSTRACT

A method of manufacturing a thin film transistor array panel includes forming gate lines including gate electrodes on an insulation substrate; forming a gate insulating layer, semiconductor layer, and etch stop layer on the gate lines; etching and patterning the etch stop and semiconductor layers at the same time using photolithography; ashing and partially removing a photoresist film pattern used in the patterning of the etch stop and semiconductor layers; etching the etch stop layer exposed by removed portions of the photoresist film pattern to form etch stop members; depositing ohmic contact and data metal layers onto the etch stop members, etching the ohmic contact and data metal layers at the same time using photolithography to form data lines having source and drain electrodes, and ohmic contact members below the source and drain electrodes; forming a passivation layer on the data lines and drain electrodes; and forming pixel electrodes on the passivation layer.

18 Claims, 27 Drawing Sheets

U.S. PATENT DOCUMENTS

| | | |
|---|---|---|
| 2005/0082968 A1 | 4/2005 | Choi et al. |
| 2005/0242347 A1 | 11/2005 | Lai |
| 2006/0050192 A1* | 3/2006 | Cho et al. .................. 349/42 |
| 2008/0003726 A1* | 1/2008 | Park ........................ 438/149 |

FOREIGN PATENT DOCUMENTS

| | | |
|---|---|---|
| CN | 1728363 | 2/2006 |
| JP | 07-218931 | 8/1995 |
| JP | 08-321621 | 12/1996 |
| JP | 10-186408 | 7/1998 |
| JP | 11-121762 | 4/1999 |
| JP | 2003-228082 | 8/2003 |
| JP | 2005-108931 | 4/2005 |
| KR | 1994-008124 | 4/1994 |
| KR | 1996-006080 | 2/1996 |
| KR | 1998-012127 | 4/1998 |
| KR | 1020020054911 | 7/2002 |
| KR | 1020030032242 | 4/2003 |
| KR | 10-0522436 | 10/2005 |

* cited by examiner

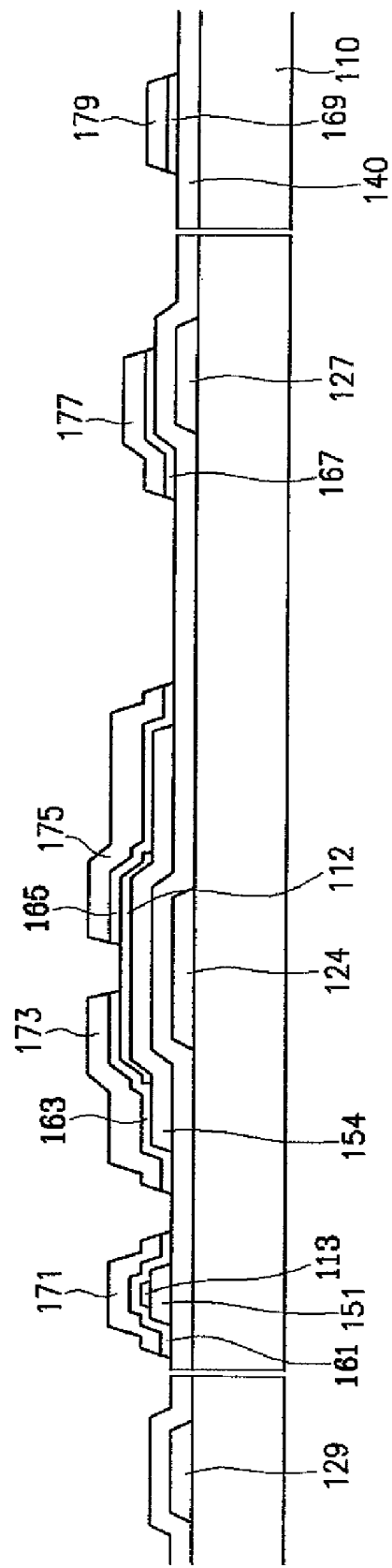

THIN FILM TRANSISTOR ARRAY PANEL FOR A DISPLAY DEVICE AND A METHOD OF MANUFACTURING THE SAME

CROSS-REFERENCE TO RELATED APPLICATION

This application is a divisional of U.S. application Ser. No. 11/627,683 filed on Jan. 26, 2007, now abandoned which claims priority to Korean Patent Application No. 10-2006-0036719 filed in the Korean Intellectual Property Office on Apr. 24, 2006, the disclosures of which are incorporated by reference herein in their entirety.

BACKGROUND OF THE INVENTION

1. Technical Field

The present invention relates to a thin film transistor array panel for a display device and a method of manufacturing the same.

2. Discussion of the Related Art

Liquid crystal displays are among the most widely used flat panel displays. For example, flat panel liquid crystal displays are commonly found in a variety of electronic devices such as televisions, laptop computers, personal digital assistants, cell phones and digital cameras.

A liquid crystal display has two substrates on which electrodes are formed, and a liquid crystal layer interposed between the substrates. The liquid crystal display is a display device in which a voltage is applied to the electrodes to rearrange liquid crystal molecules in the liquid crystal layer to control the amount of light passing through the substrates.

A liquid crystal display having field generating electrodes respectively provided on two display panels is now widely used. In this configuration, a plurality of pixel electrodes are arranged on a display panel in a matrix shape, and a common electrode covers the entire surface of the other display panel. In such a liquid crystal display, an additional voltage is applied to the pixel electrodes to perform image display. To accomplish this, thin film transistors, which are three-terminal elements, are respectively connected to the pixel electrodes to switch the voltage to be applied to the pixel electrodes. Further, gate lines that transmit signals for controlling the thin film transistors and data lines that transmit the voltage to be applied to the pixel electrodes are formed on the display panel.

Each of the thin film transistors functions as a switching element that transmits or blocks an image signal to be transmitted through the data line to the pixel electrode, depending on a scanning signal that is transmitted through the gate line. Each of the thin film transistors also functions as a switching element that individually controls a light-emitting device, for example, in an Active Matrix Organic Light-Emitting Device (AM-OLED).

SUMMARY OF THE INVENTION

Such thin film transistors are classified into a bottom gate type and a top gate type according to the structures. The bottom gate type is further classified into an etch back type and an etch stopper type. The bottom gate type is mainly applied to a thin film transistor using a semiconductor formed of amorphous silicon. For the etch back type of thin film transistor, the manufacturing process is relatively simple compared with the etch stopper type, but reliability and charge mobility are low. Meanwhile, the etch stopper type has excellent reliability and charge mobility compared with the etch back type. However, in the etch stopper type, an additional manufacturing process is required to form an etch stopper.

Embodiments of the present invention have been made in an effort to provide a thin film transistor array panel for a display device and a method of manufacturing the same, having advantages of simplifying a manufacturing process of an etch stopper type of thin film transistor array panel.

According to an exemplary embodiment of the present invention, a thin film transistor array panel includes an insulation substrate, gate lines that are formed on the insulation substrate and that have gate electrodes, a gate insulating layer that is formed on the gate lines, semiconductors that are formed on the gate insulating layer, etch stop members that are formed on portions of the semiconductors, ohmic contact members that are formed on the etch stop members and that partially contact the semiconductors, a data wire layer that is formed on the ohmic contact members and that has substantially the same planar pattern as that of the ohmic contact members, a passivation layer that is formed on the data wire layer and that has contact holes, and pixel electrodes that are formed on the passivation layer and that are connected to portions of the data wire layer through the contact holes.

The data wire layer may have data lines that have source electrodes and intersect the gate lines, drain electrodes that are disposed on the gate electrodes and face the source electrodes, and storage capacitor conductors that overlap the gate lines.

Each of the semiconductors may have a linear portion that is formed below a corresponding data line and a protruding portion that extends from the linear portion over a corresponding source electrode and drain electrode. Each of the etch stop members may have a protruding portion that is formed on the protruding portion of a corresponding semiconductor to cover the corresponding semiconductor located between the corresponding source electrode and drain electrode.

Each of the etch stop members may further have a linear portion that is formed on the linear portion of the corresponding semiconductor and that may be located within an area defined by sides of the linear portion of the corresponding semiconductor. The protruding portion of the etch stop members may be located within an area defined by sides of the protruding portion of the corresponding semiconductor.

Each of the semiconductors may be formed of amorphous silicon, and each of the etch stop members may be formed of silicon nitride.

According to an exemplary embodiment of the present invention, a method of manufacturing a thin film transistor array panel includes forming gate lines having gate electrodes on an insulation substrate; forming a gate insulating layer, a semiconductor layer, and an etch stop layer on the gate lines; etching and patterning the etch stop layer and semiconductor layer at the same time using photolithography; ashing and partially removing a photoresist film pattern used in the etching and patterning of the etch stop layer and the semiconductor layer; etching the etch stop layer exposed by removed portions of the photoresist film pattern to form etch stop members; depositing an ohmic contact layer and a data metal layer onto the etch stop members; etching the ohmic contact layer and the data metal layer at the same time using photolithography to form data lines having source electrodes, drain electrodes facing the source electrodes, and ohmic contact members below the source electrodes and the drain electrodes; forming a passivation layer on the data lines and the drain electrodes; and forming pixel electrodes on the passivation layer.

Each of the ohmic contact members may be formed to have substantially the same planar pattern as that of a data line and drain electrode formed thereon.

The method may further include connecting the pixel electrodes to the drain electrodes. The gate insulating layer, semiconductor layer, and etch stop layer may be sequentially formed on the gate lines.

According to an exemplary embodiment of the present invention, a thin film transistor array panel includes an insulation substrate; gate lines that are formed on the insulation substrate and that have first gate electrodes, second gate electrodes, and storage electrodes that are formed on the insulation substrate; a gate insulating layer that is formed on the gate lines, the second gate electrodes, and the storage electrodes; first and second semiconductors that are formed on the gate insulating layer; first and second etch stop members that are formed on portions of the first and second semiconductors, respectively; ohmic contact members that are formed on the first and second etch stop members and that partially contact the semiconductors; a data wire layer that is formed on the ohmic contact member and that has substantially the same planar pattern as that of the ohmic contact members; a passivation layer that is formed on the data wire layer and that has a plurality of contact holes; and pixel electrodes that are formed on the passivation layer and that are connected to portions of the data wire layer through the contact holes.

The data wire layer may have data lines that have first source electrodes and intersect the gate lines, first drain electrodes that are disposed on the first gate electrodes and face the first source electrodes, power lines that have second source electrodes and intersect the gate lines, and second drain electrodes that are disposed on the second gate electrodes and face the second source electrodes. The thin film transistor array panel may further include connecting members that electrically connect the first drain electrodes and the second gate electrodes to each other.

Each of the first semiconductors may have a linear portion that is formed below a corresponding data line, and a first channel portion that extends from the linear portion over a corresponding first source electrode and first drain electrode. Each of the second semiconductors may have a storage electrode portion that overlaps a corresponding storage electrode, and a second channel portion that extends over a corresponding second source electrode and second drain electrode. Each of the first etch stop members may cover the first semiconductor between the corresponding first source electrode and first drain electrode. Each of the second etch stop members may cover the second semiconductor between the corresponding second source electrode and second drain electrode.

The first and second semiconductors may be formed of amorphous silicon, and the first and second etch stop members may be formed of silicon nitride.

The thin film transistor array panel may further include partition walls that are formed on the pixel electrodes, a light emission layer that fills frames defined by the partition walls, and a common electrode that is formed on the light emission layer.

According to an exemplary embodiment of the present invention, a method of manufacturing a thin film transistor array panel includes forming gate lines having first gate electrodes, second gate electrodes, and storage electrodes on an insulation substrate; forming a gate insulating layer, a semiconductor layer, and an etch stop layer on the gate lines, the second gate electrodes, and the storage electrodes; etching and patterning the etch stop layer and the semiconductor layer at the same time using photolithography; ashing and partially removing a photoresist film pattern used in the etching and patterning of the etch stop layer and the semiconductor layer; etching the etch stop layer exposed by removed portions of the photoresist film pattern to form first and second etch stop members; depositing an ohmic contact layer and a data metal layer onto the first and second etch stop members; etching the ohmic contact layer and the data metal layer at the same time using photolithography to form data lines having first source electrodes, drain electrodes facing the first source electrodes, power lines having second source electrodes, second drain electrodes facing the second source electrodes, and ohmic contact members below the drain electrodes; forming a passivation layer on the data lines, the first drain electrodes, the power lines, and the second drain electrodes; and forming pixel electrodes on the passivation layer that are connected to the second drain electrodes and connecting members electrically connecting the first drain electrodes and second gate electrodes to each other.

Each of the ohmic contact members may be formed to have substantially the same pattern as that of a corresponding data line, first drain electrode, power line, and second drain electrode formed thereon.

The method may further include forming partition walls on the pixel electrodes, forming an organic light emission layer that fills frames defined by the partition walls, and forming a common electrode on the organic light emission layer.

The gate insulating layer, semiconductor layer, and etch stop layer may be sequentially formed on the gate lines, the second gate electrodes, and the storage electrodes.

BRIEF DESCRIPTION OF THE DRAWINGS

FIG. 6B is a cross-sectional view taken along line VIb-VIb' of FIG. 6A.

DETAILED DESCRIPTION OF EXEMPLARY EMBODIMENTS

Figure 1:
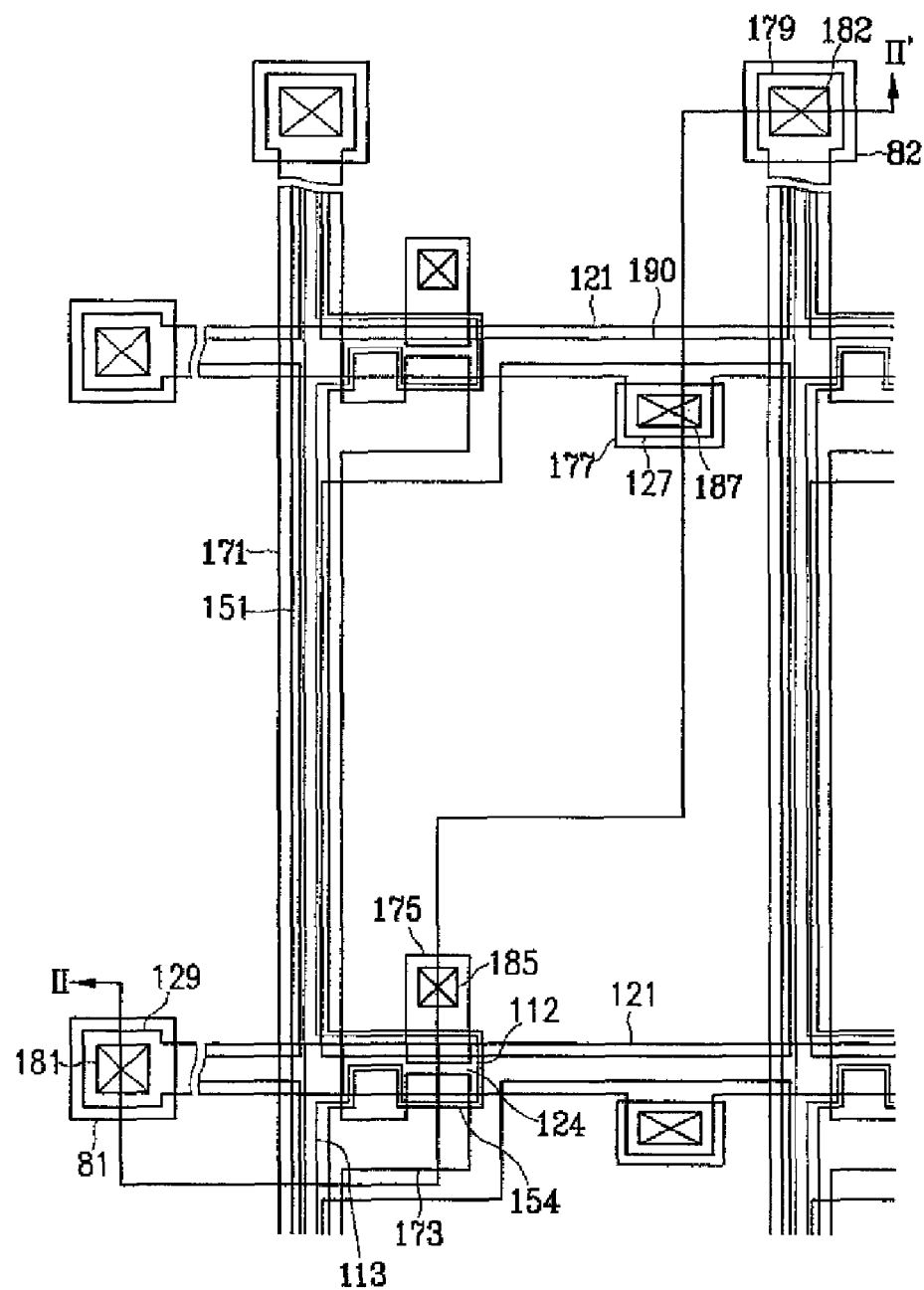
FIG. 1 is a layout view of a thin film transistor array panel according to an exemplary embodiment of the present invention.

The present invention will be described more fully hereinafter with reference to the accompanying drawings, in which exemplary embodiments of the invention are shown. The present invention may, however, be embodied in many different forms and should not be construed as limited to the embodiments set forth herein. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A thin film transistor array panel according to an exemplary embodiment of the present invention will be described in detail with reference to FIGS. 1 and 2.

Figure 2:
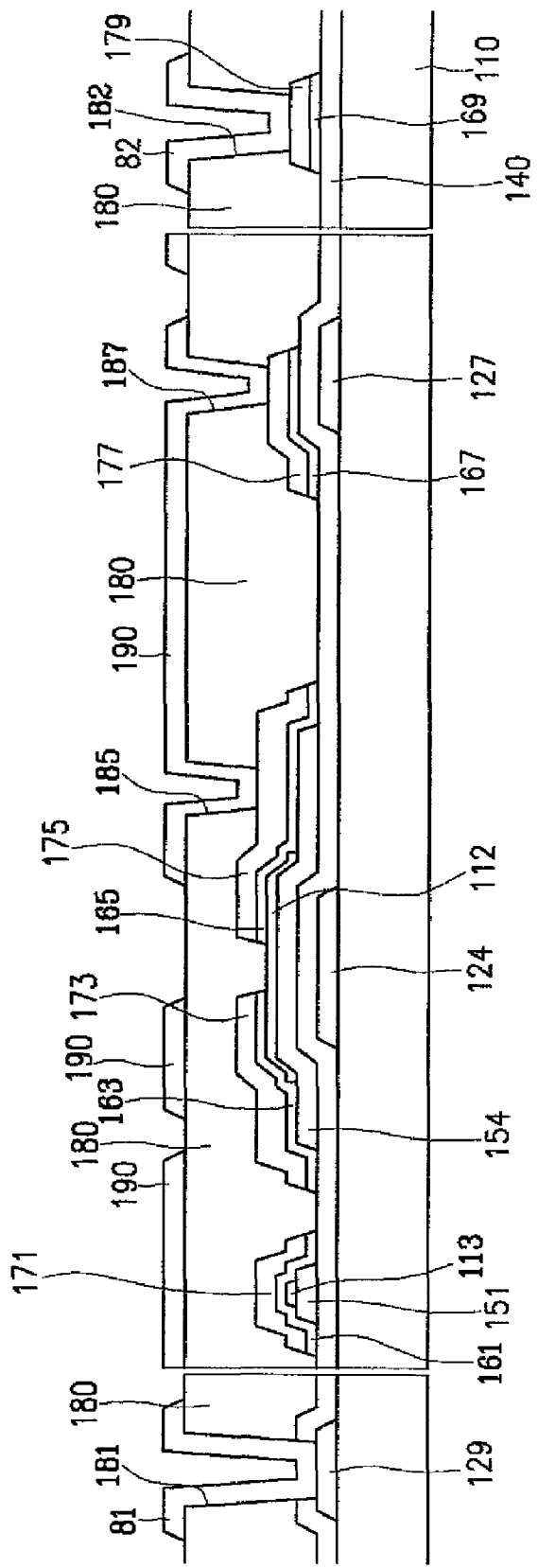
FIG. 2 is a cross-sectional view of the thin film transistor array panel of FIG. 1 taken along line II-II'.

FIG. 1 is a layout view of a thin film transistor array panel according to an exemplary embodiment of the present invention, and FIG. 2 is a cross-sectional view of the thin film transistor array panel of FIG. 1 taken along line II-II'.

As shown in FIGS. 1 and 2, a plurality of gate lines 121 that transmit gate signals are formed on an insulation substrate 110 formed of transparent glass or the like. The gate lines 121 extend in a horizontal direction and portions of the gate lines 121 form a plurality of gate electrodes 124. Other portions of the gate lines 121 protrude downward and form a plurality of expansions 127, and still other portions of the gate lines 121 form ends 129 for connection to an external circuit.

A gate electrode 124, a source electrode 173, and a drain electrode 175 form a thin film transistor, together with a protruding portion 154 of a semiconductor stripe 151. A channel of the thin film transistor is formed at the protruding portion 154 between the source electrode 173 and the drain electrode 175. A storage capacitor conductor 177 overlaps the expansion 127 of the gate line 121.

Each of the gate lines 121 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), or the like. However, the gate lines 121 may have a multilayer structure having two conductive layers (not shown) with different physical properties. One conductive layer is formed of a metal with low resistivity, for example an aluminum-based metal, a silver-based metal, and a copper-based metal to reduce a signal delay or voltage drop. On the other hand, the other conductive layer is formed of a different material particularly a material with excellent physical, chemical, and electrical contact characteristics to Indium Tin Oxide (ITO) and Indium Zinc Oxide (IZO), for example a molybdenum-based metal, chromium, tantalum, titanium, or the like. An exemplary multi-layered structure may include a chromium lower layer and an aluminum (alloy) upper layer or an aluminum (alloy) lower layer and a molybdenum (alloy) upper layer.

A side of the gate line 121 is inclined at an angle of about 30 to about 80 degrees with respect to a surface of the substrate 110.

A gate insulating layer 140 formed of silicon nitride ($SiN_x$) or the like is formed on the gate line 121.

A plurality of semiconductor stripes 151 formed of hydrogenated amorphous silicon or the like are formed on the gate insulating layer 140. Each of the semiconductor stripes 151 extends in a vertical direction, and a plurality of protruding portions 154 protrude from the semiconductor stripe 151 toward the gate electrode 124. In addition, the semiconductor stripe 151 has a larger width where the semiconductor stripe 151 meets the gate line 121.

Etch stop members 112 and 113 formed of silicon nitride ($SiN_x$) are formed on the semiconductor stripe 151. Each of the etch stop members 112 and 113 includes a linear portion 113 that is formed along the semiconductor stripe 151, and a protruding portion 112 that is formed on the protruding portion 154 of the semiconductor stripe 151. Each of the etch stop members 112 and 113 has a width smaller than that of the protruding portion 154 and the semiconductor stripe 151, respectively, and a distance from a side of the protruding portion 154 to a side of the etch stop member 112 is substantially the same at all points on a perimeter of the etch stop member 112 and a distance from a side of the semiconductor stripe 151 to a side of the etch stop member 113 is substantially the same at all points on a perimeter of the etch stop member 113. The etch stop members 112 and 113 are disposed in an area defined by the sides of the semiconductor stripe 151 and the protruding portion 154.

A plurality of ohmic contact stripes and islands 161 and 165 formed of a material such as n+ hydrogenated amorphous silicon doped with an n-type impurity at a high concentration are formed on the etch stop members 112 and 113. Each of the ohmic contact stripes 161 has a plurality of protruding portions 163, and each of the protruding portions 163 and each of the ohmic contact islands 165 are disposed in a pair on the protruding portion 154 of the semiconductor stripe 151. The protruding portion 163 of the ohmic contact stripe 161 and the ohmic contact island 165 are in contact with the protruding portion 154 of the semiconductor stripe 151, which is not covered with the protruding portion 112 of the etch stop member. Since the ohmic contact stripe 161 has a larger width than that of the semiconductor stripe 151, it covers the semiconductor stripe 151, excluding the protruding portion 154 of the semiconductor stripe 151. However, the width of the ohmic contact stripe 161 may be the same as that of the semiconductor stripe 151.

A plurality of data lines 171, a plurality of the drain electrodes 175, and a plurality of the storage capacitor conductors 177 are formed on the ohmic contact members 161, 163 and 165, and ohmic contact member 167.

The data lines 171 extend in the vertical direction to intersect the gate lines 121, and transmit a data voltage. A plurality of branches that extend from each of the data lines 171 toward the drain electrode 175 form the source electrodes 173. A source electrode 173 and drain electrode 175 are separated from each other and are disposed on opposing sides with respect to the gate electrode 124.

The planar shape of the data line 171 having the source electrode 173, the drain electrode 175, and the storage capacitor conductor 177 is substantially the same as the ohmic contact stripe 161 and ohmic contact island 165. This is because the ohmic contact members 161 and 165, the data line 171, the drain electrode 175 and the storage capacitor conductor 177, are simultaneously etched and patterned using one photolithography process.

The data line 171, the drain electrode 175, and the storage capacitor conductor 177 may be formed of a refractory metal such as molybdenum, chromium, tantalum, or titanium, or an alloy thereof, and may have a multilayer structure having a refractory metal film (not shown) and a low-resistance conductive layer (not shown). Exemplary multi-layered structures may include a two-layered film of a chromium or molybdenum (alloy) lower layer and an aluminum (alloy) upper layer, and a three-layered film of a molybdenum (alloy) lower layer, an aluminum (alloy) intermediate layer, and a molybdenum (alloy) upper layer. The data line 171, the drain electrode 175, and the storage capacitor conductor 177, however, may be formed of various metals or conductors in addition to the above-mentioned materials.

Sides of the data line 171, the drain electrode 175, and the storage capacitor conductor 177 are formed to have an inclined angle of about 30 to about 80 degrees.

The ohmic contact members 161 and 165 are disposed between the underlying semiconductor layer 154 and the overlying source electrode 173 and drain electrode 175, and function to reduce contact resistance.

A portion of the protruding portion 112 of the etch stop member between the source electrode 173 and drain electrode 175 remains exposed, not covered with the data line 171 and the drain electrode 175.

A passivation layer 180 formed of an organic material with an excellent planarization characteristic and photosensitivity, a low-dielectric constant insulating material such as a-Si:C:O and a-Si:O:F formed by Plasma Enhanced Chemical Vapor Deposition (PECVD), or an inorganic material such as silicon nitride ($SiN_x$) or the like is formed on the data line 171, the drain electrode 175, the storage capacitor conductor 177, and the exposed semiconductor stripe 151 in a single layer or multiple layers.

A plurality of contact holes 185, 187, and 182, which expose the drain electrode 175, the storage capacitor conductor 177, and an end 179 of the data line 171, respectively, are formed in the passivation layer 180. Further, a contact hole 181 is formed to pass through the passivation layer 180 and the gate insulating layer 140 to expose the end 129 of the gate line 121.

A plurality of pixel electrodes 190 and contact assistants 81 and 82 formed of ITO or IZO are formed on the passivation layer 180.

The pixel electrode 190 is physically and chemically connected to the drain electrode 175, the storage capacitor conductor 177, and the data line 171 through the contact holes 185 and 187. The pixel electrode 190 is supplied with the data voltage from the drain electrode 175 and transmits the data voltage to the storage capacitor conductor 177.

The pixel electrode 190 with the applied data voltage generates an electric field together with a common electrode (not shown) of another display panel (not shown) with an applied common voltage, and rearranges liquid crystal molecules of a liquid crystal layer interposed therebetween.

The pixel electrode 190 and common electrode (not shown) form a liquid crystal capacitor and hold the applied voltage even when the thin film transistor is turned off. An additional capacitor (referred to as a "storage capacitor") is coupled in parallel to the liquid crystal capacitor and is provided to enhance the voltage holding capacity of the liquid crystal capacitor. The storage capacitor may be formed by overlapping the pixel electrode 190 and an adjacent gate line 121 (referred to as a "previous gate line"). To increase electrostatic capacitance, for example, storage capacitance of the storage capacitor, an expansion 127 formed by expanding the gate line 121 is provided to increase the area of the gate line 121 overlapped by the storage capacitor conductor 177. Further, the storage capacitor conductor 177 that is connected to the pixel electrode 190 and overlaps the expansion 127 is disposed below the passivation layer 180 to reduce a distance between the pixel electrode 190 and the expansion 127 Meanwhile, a separate storage electrode line may be formed and overlap the pixel electrode 190, instead of overlapping the previous gate line 121 and the pixel electrode 190 to form the storage capacitor.

When the passivation layer 180 is formed of an organic material having a low dielectric constant, an aperture ratio may be increased by overlapping the pixel electrode 190, and the adjacent gate line 121 and data line 171.

The contact assistants 81 and 82 are connected to the ends 129 and 179 of the gate line 121 and the data line 171 through the contact holes 181 and 182, respectively. The contact assistants 81 and 82 complement adhesion of the ends 129 and 179 of the gate line 121 and data line 171, respectively, to an external device, such as a driver IC, and protect them.

A method of manufacturing the thin film transistor array panel shown in FIGS. 1 and 2 according to an exemplary embodiment of the present invention will now be described in detail with reference to FIGS. 3A to 7B.

Figure 3A:
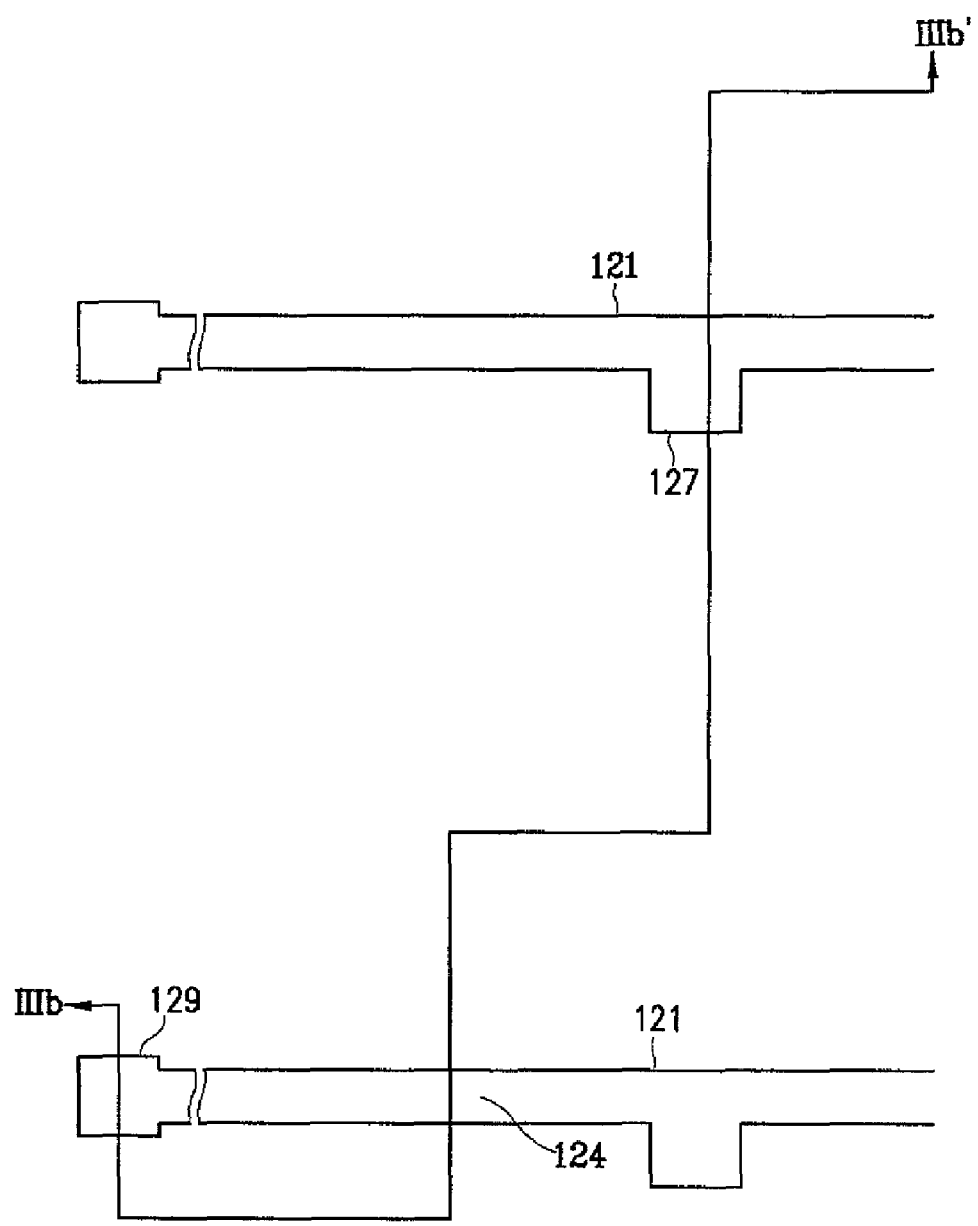
FIG. 3A, FIG. 4A, FIG. 5A, FIG. 6A, and FIG. 7A are layout views of the thin film transistor array panel shown in FIGS. 1 and 2 during a manufacturing process thereof according to an exemplary embodiment of the present invention.
Figure 3B:
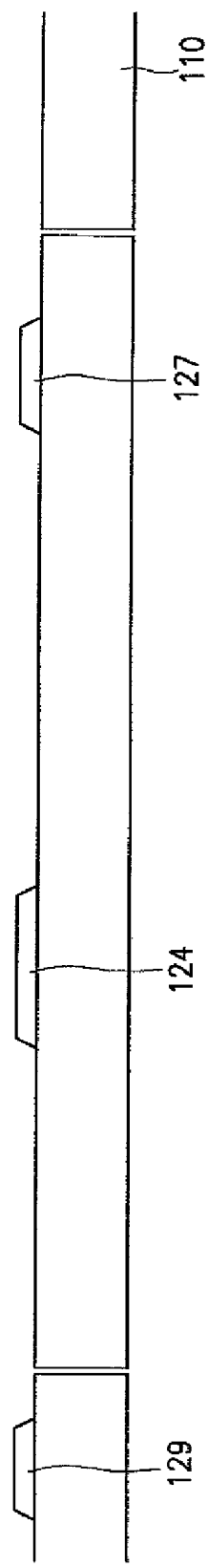
FIG. 3B is a cross-sectional view taken along line IIIb-IIIb' of FIG. 3A.
Figure 4A:
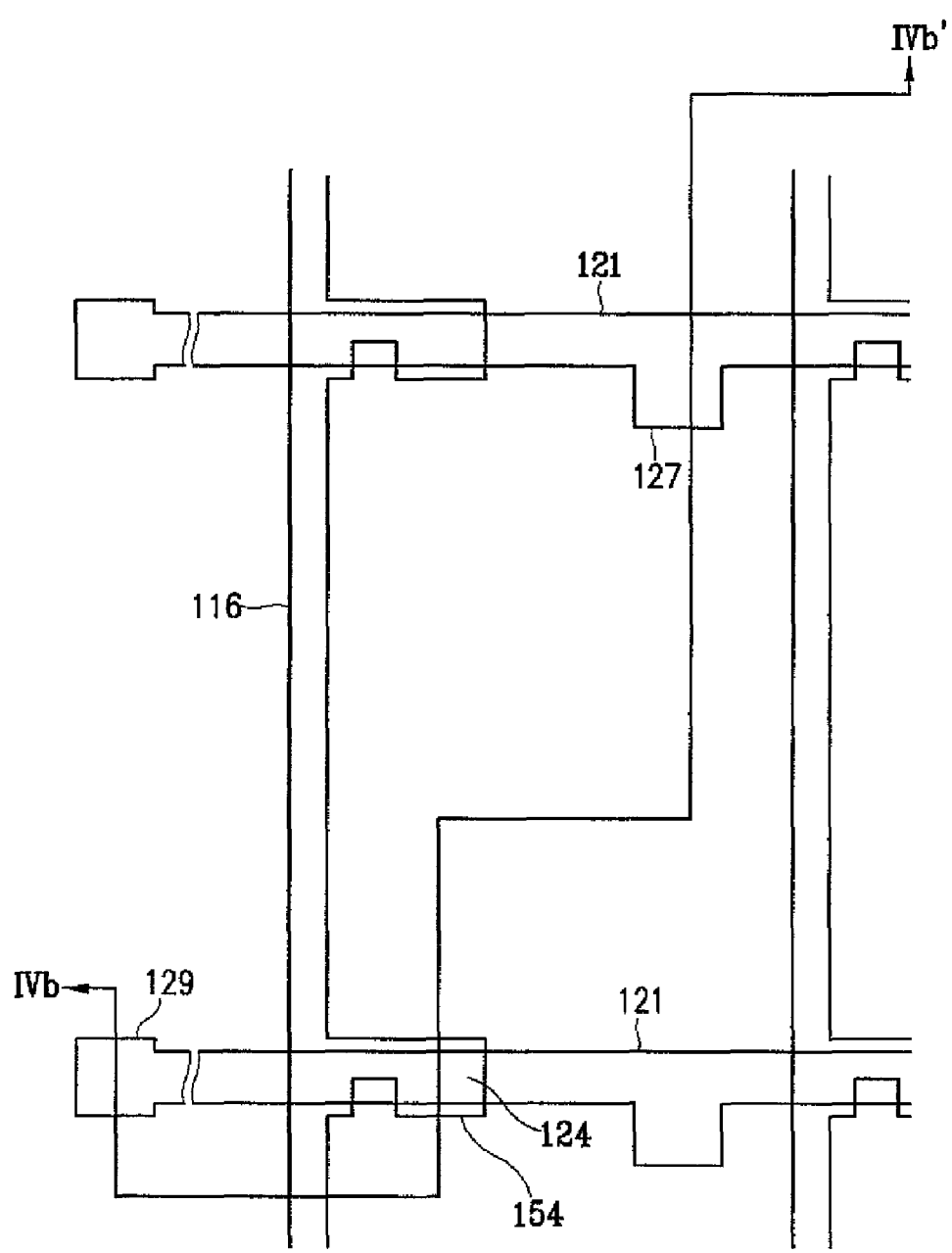
Figure 4B:
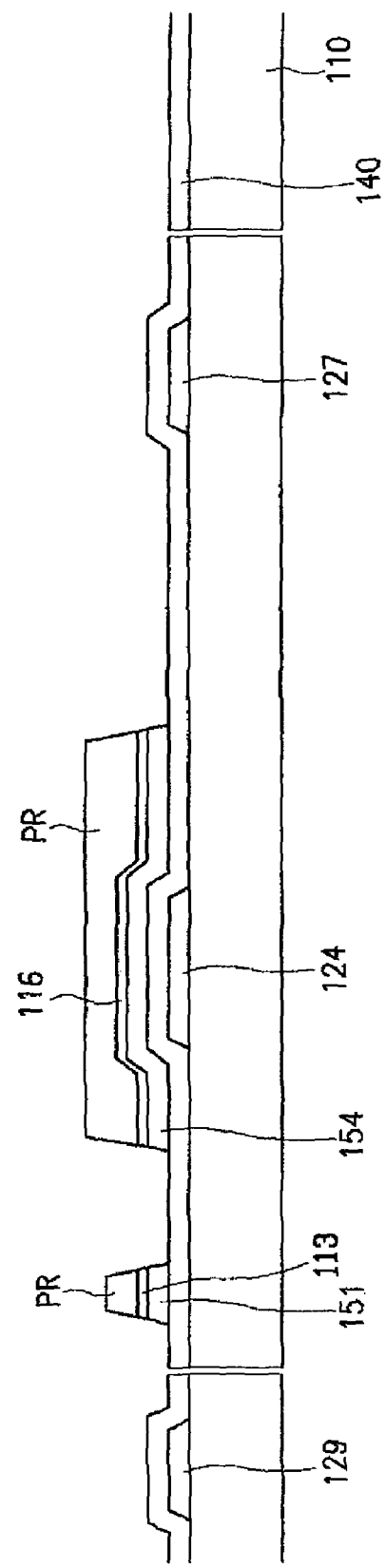
FIG. 4B is a cross-sectional view taken along line IVb-IVb' of FIG. 4A.
Figure 5A:
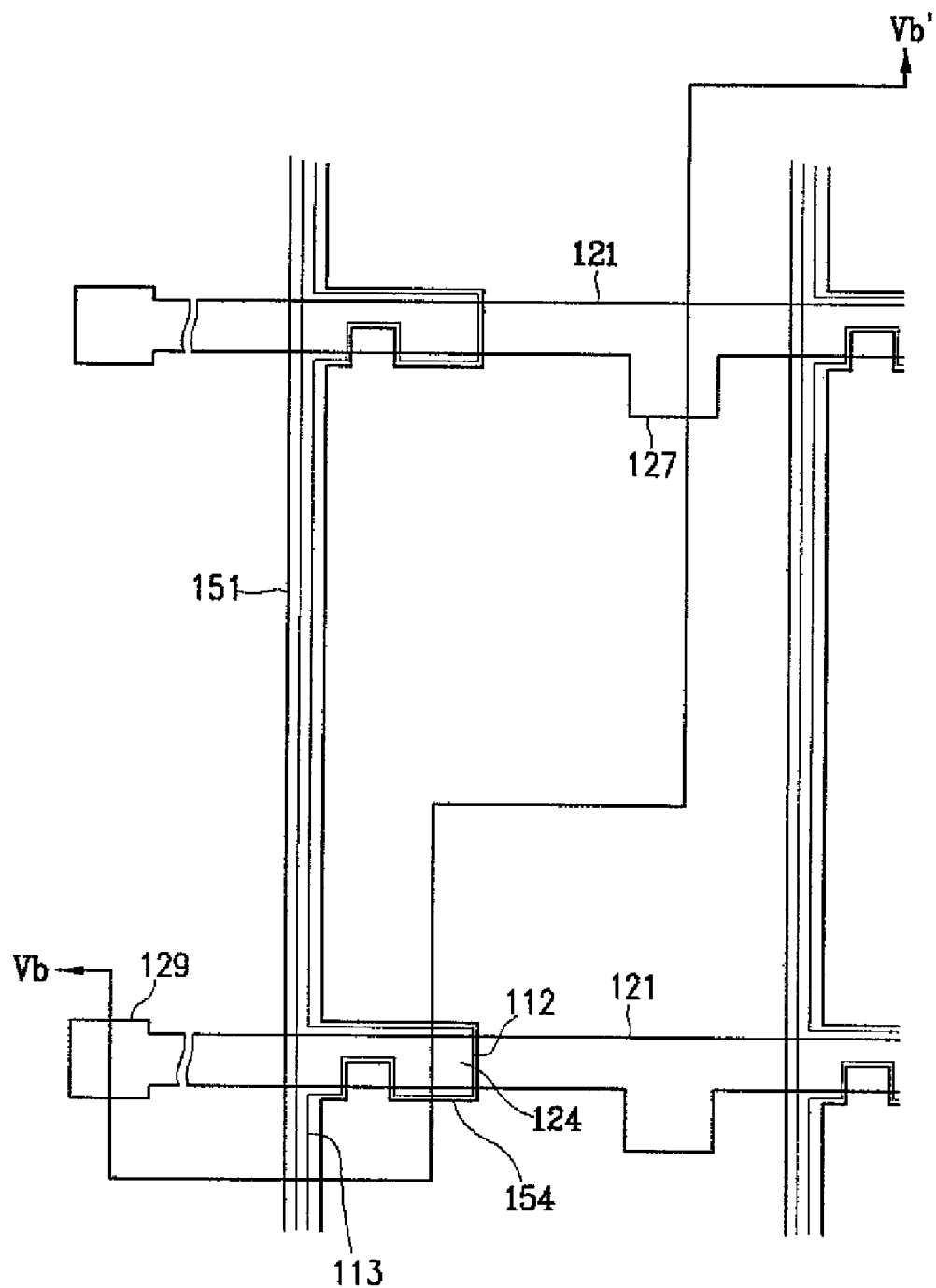
Figure 5B:
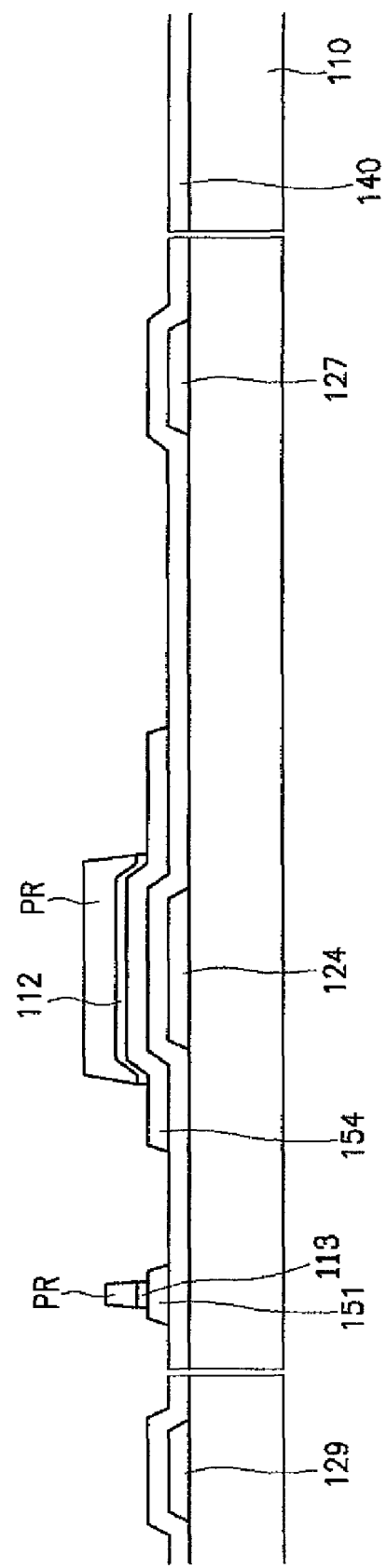
FIG. 5B is a cross-sectional view taken along line Vb-Vb' of FIG. 5A.
Figure 6A:
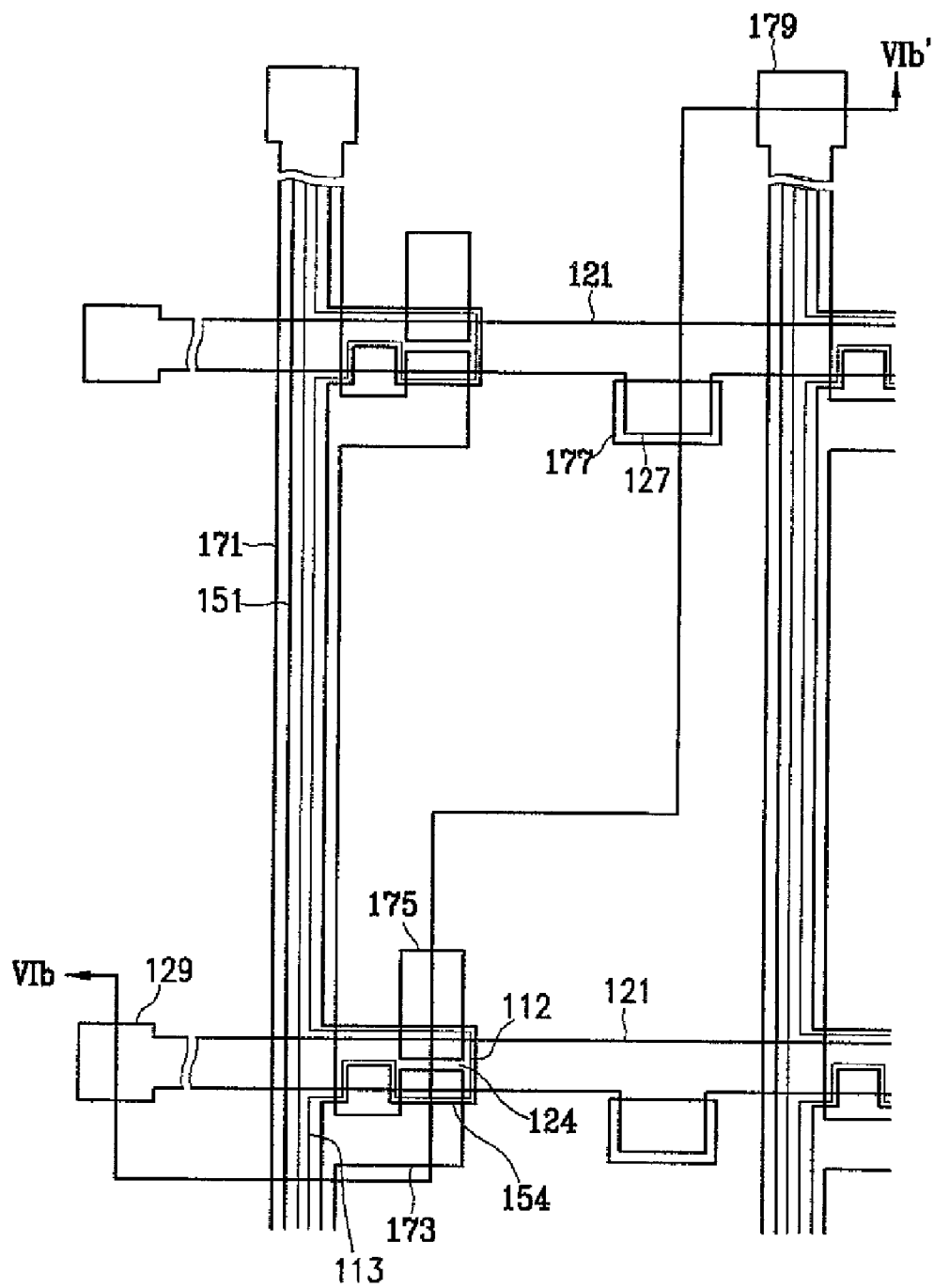

FIG. 3A, FIG. 4A, FIG. 5A, FIG. 6A and FIG. 7A are layout views of the thin film transistor array panel shown in FIGS. 1 and 2 during a manufacturing process thereof according to the exemplary embodiment of the present invention. FIG. 3B is a cross-sectional view taken along line IIIb-IIIb' of FIG. 3A, FIG. 4B is a cross-sectional view taken along line IVb-IVb' of FIG. 4A, FIG. 5B is a cross-sectional view taken along line Vb-Vb' of FIG. 5A, FIG. 6B is a cross-sectional view taken along line VIb-VIb' of FIG. 6A and FIG. 7B is a cross-sectional view taken along line VIIb-VIIb' of FIG. 7A.

As shown in FIGS. 3A and 3B, a gate metal layer formed of aluminum (Al) or an aluminum alloy is deposited on the insulation substrate 110 formed of transparent glass. The gate lines 121 having the plurality of gate electrodes 124, the expansions 127, and the ends 129 for connection to an external circuit are formed by etching the gate metal layer using photolithography. Each of the gate lines 121 may have a two-layered structure of chromium and aluminum. In this case, the chromium and aluminum layers may have thicknesses of about 500 Å and about 2500 Å, respectively.

As shown in FIGS. 4A and 4B, the gate insulating layer 140 is formed by depositing silicon nitride ($SiN_x$) or silicon oxide ($SiO_2$) to cover the gate lines 121 having the gate electrodes 124. An intrinsic amorphous silicon layer and an etch stop layer formed of silicon nitride or the like are sequentially deposited on the gate insulating layer 140. The semiconductor stripes 151 having the plurality of protruding portions 154 and pre-patterns 116 of the etch stop members 112 and 113 are formed by etching the etch stop layer and the intrinsic amorphous silicon layer using photolithography. The gate insulating layer 140, the amorphous silicon layer, and the etch stop layer may have thicknesses of about 4500 Å, about 500 Å, and about 1500 Å, respectively. Moreover, the gate insulating layer 140 may have a two-layered structure of silicon oxide ($SiO_2$) and silicon nitride. In this case, the silicon oxide layer and the silicon nitride layer may have thicknesses of about 1500 Å and about 2000 Å, respectively. Reference symbol PR in FIG. 4B denotes a photoresist film used in the photolithography.

As shown in FIGS. 5A and 5B, if a portion of the photoresist film PR is removed by ashing, the photoresist film PR is reduced in thickness and in width, and thus, the pre-patterns 116 of the etch stop members 112 and 113 are partially exposed. The etch stop members 112 and 113 are completed by etching the pre-patterns 116. Here, the amount of ashing of the photoresist film PR is adjusted according to the width of each of the etch stop members 112 and 113 to be formed. If the photoresist film PR is excessively ashed, the linear portion 113 of the etch stop members 112 and 113 may not be formed. The remaining photoresist film PR is removed.

As shown in FIGS. 6A and 6B, a material such as n+ hydrogenated amorphous silicon, in which an n-type impurity is doped at a high concentration, is deposited on the etch stop members 112 and 113 to form an ohmic contact layer. A data metal layer formed of a refractory metal such as molybdenum, chromium, tantalum, or titanium, or an alloy thereof, is deposited on the ohmic contact layer. The ohmic contact layer and the data metal layer may thicknesses of about 500 Å and about 1500 Å, respectively. The ohmic contact members 161 and 165, the data lines 171, the drain electrodes 175, and the storage capacitor conductors 177 are formed by etching the data metal layer and the ohmic contact layer at the same time using photolithography.

As shown in FIG. 6B, a plurality of the ohmic contact stripes 161 each having a plurality of the protruding portions 163, and a plurality of ohmic the contact islands 165 and 167 are formed.

Figure 7A:
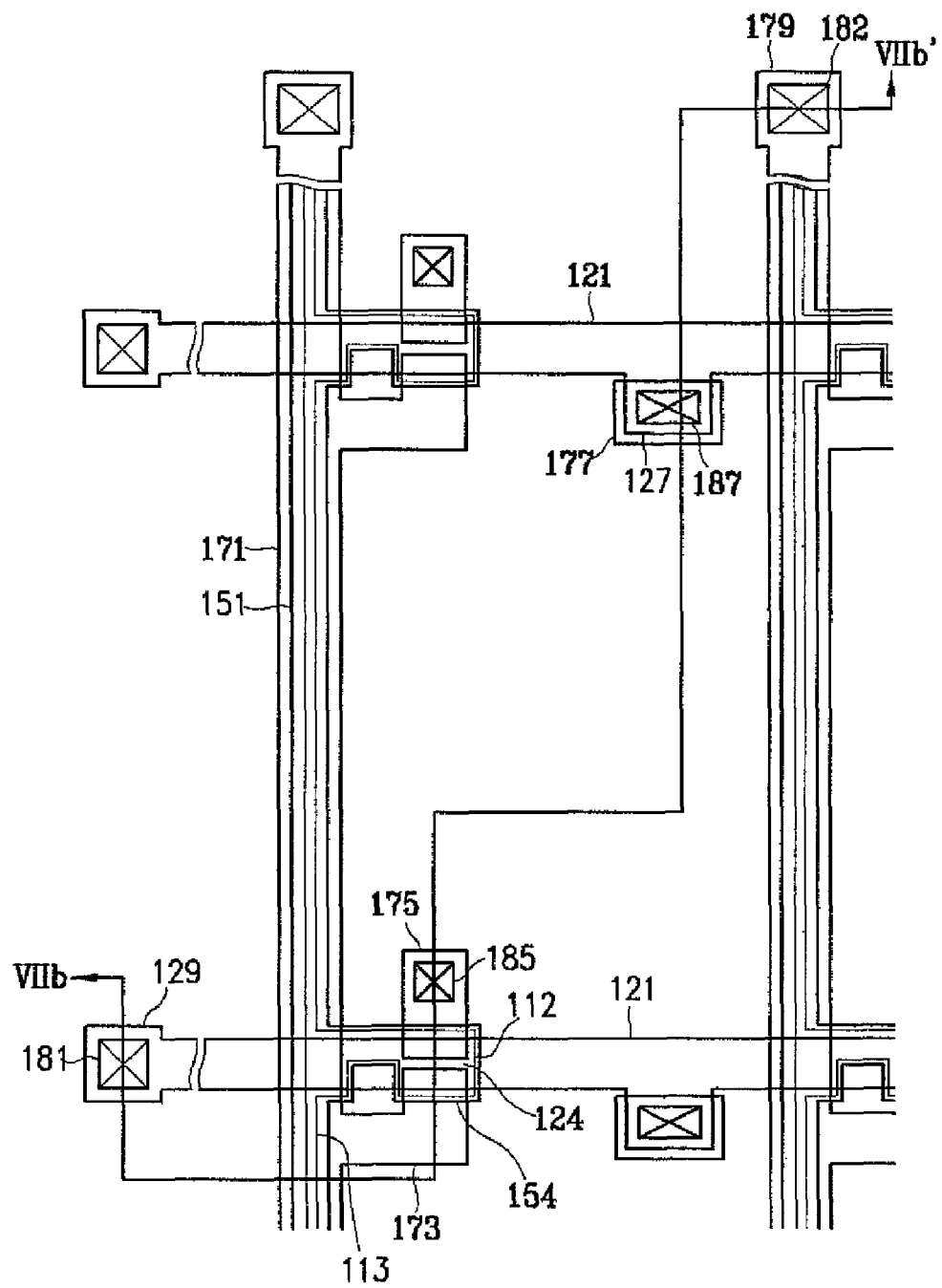
Figure 7B:
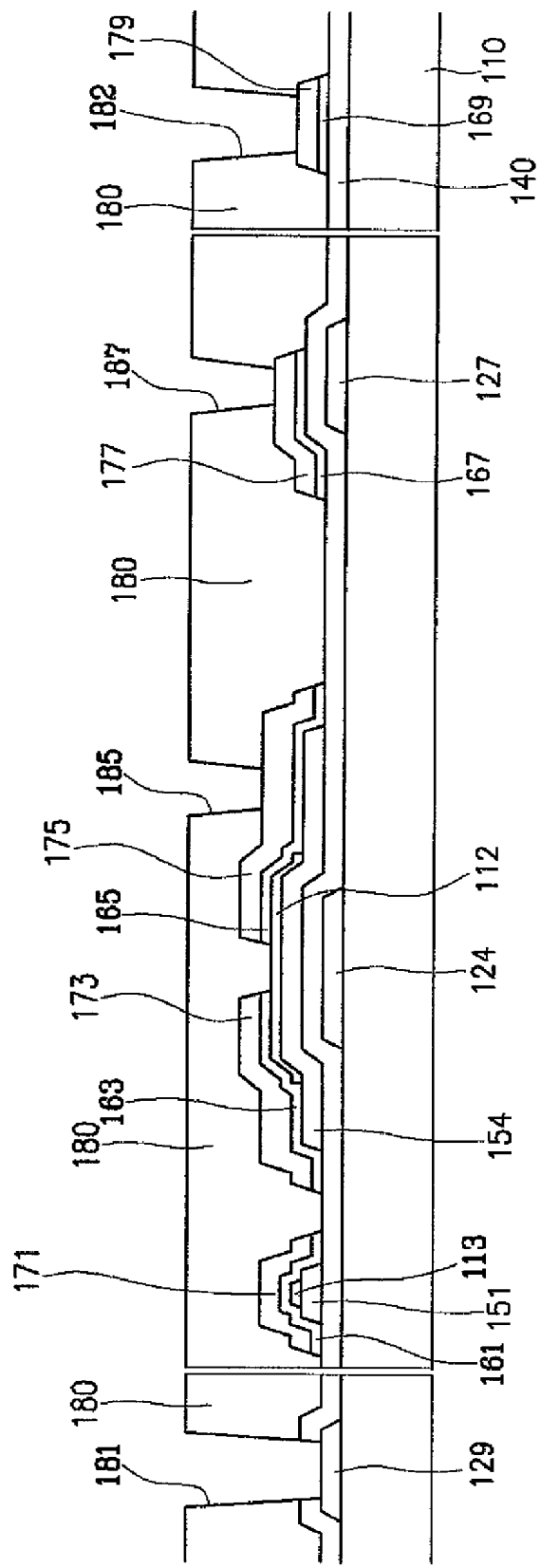
FIG. 7B is a cross-sectional view taken along line VIIb-VIIb' of FIG. 7A.

As shown in FIGS. 7A and 7B, the passivation layer 180 is formed by forming an organic material with a desired planarization characteristic and photosensitivity, a low-dielectric constant insulating material such as a-Si:C:O and a-Si:O:F formed by PECVD, or an inorganic material such as silicon nitride ($SiN_x$), in a single layer or multiple layers. When the passivation layer 180 is formed of silicon nitride, the thickness thereof may be about 2000 Å.

The plurality of contact holes 181, 185, 187, and 182 are formed by etching the passivation layer 180 and the gate insulating layer 140 using photolithography.

As shown in FIGS. 1 and 2, ITO or IZO is deposited on the substrate 110 by sputtering to form the plurality of pixel electrodes 190 and the contact assistants 81 and 82 using photolithography.

Hereinafter, a thin film transistor array panel for an organic light-emitting display device according to an exemplary embodiment of the present invention will be described in detail with reference to FIGS. 8 to 17B.

Figure 8:
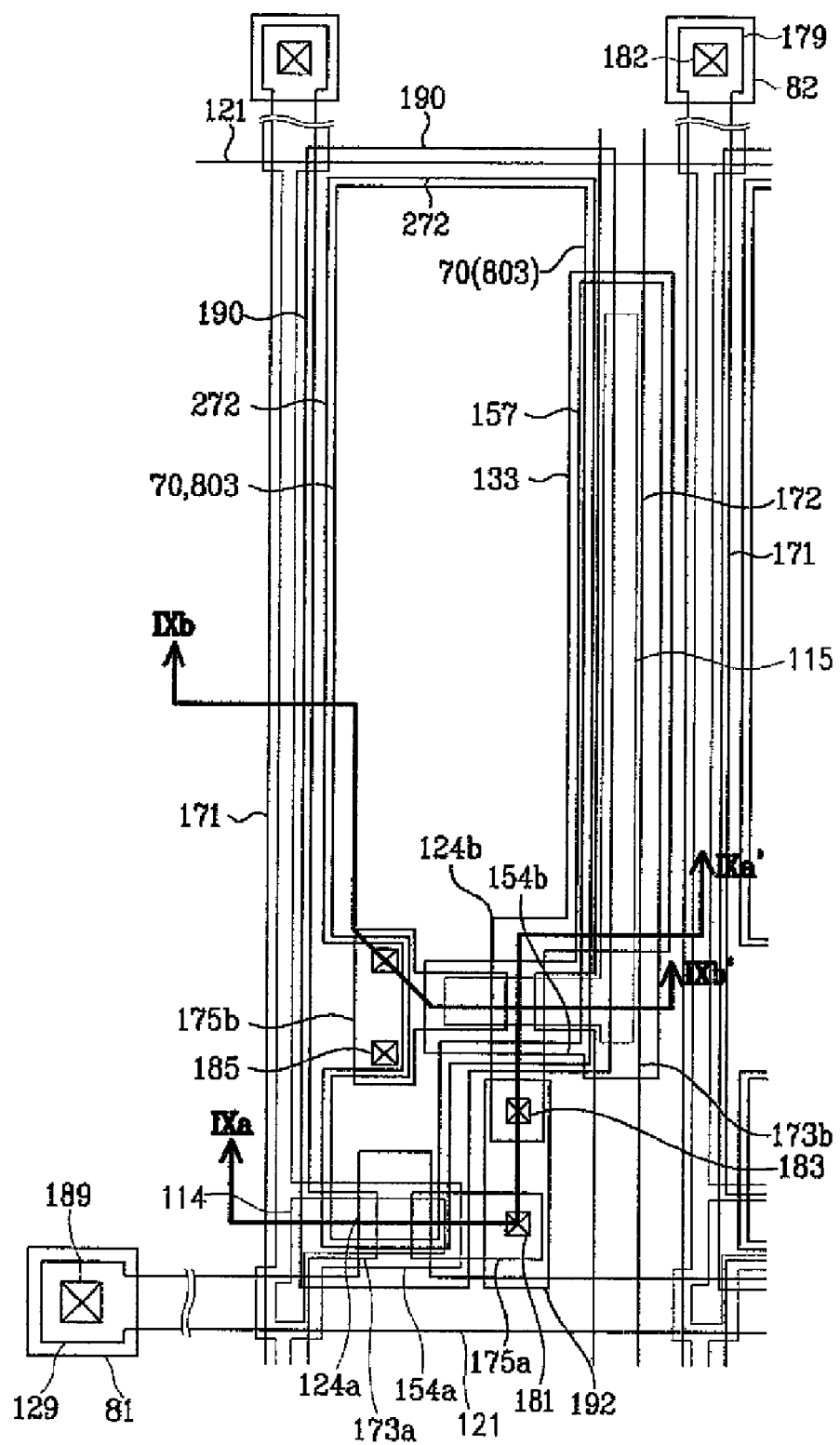
FIG. 8 is a layout view showing an organic light-emitting display device according to an exemplary embodiment of the present invention.
Figure 9A:
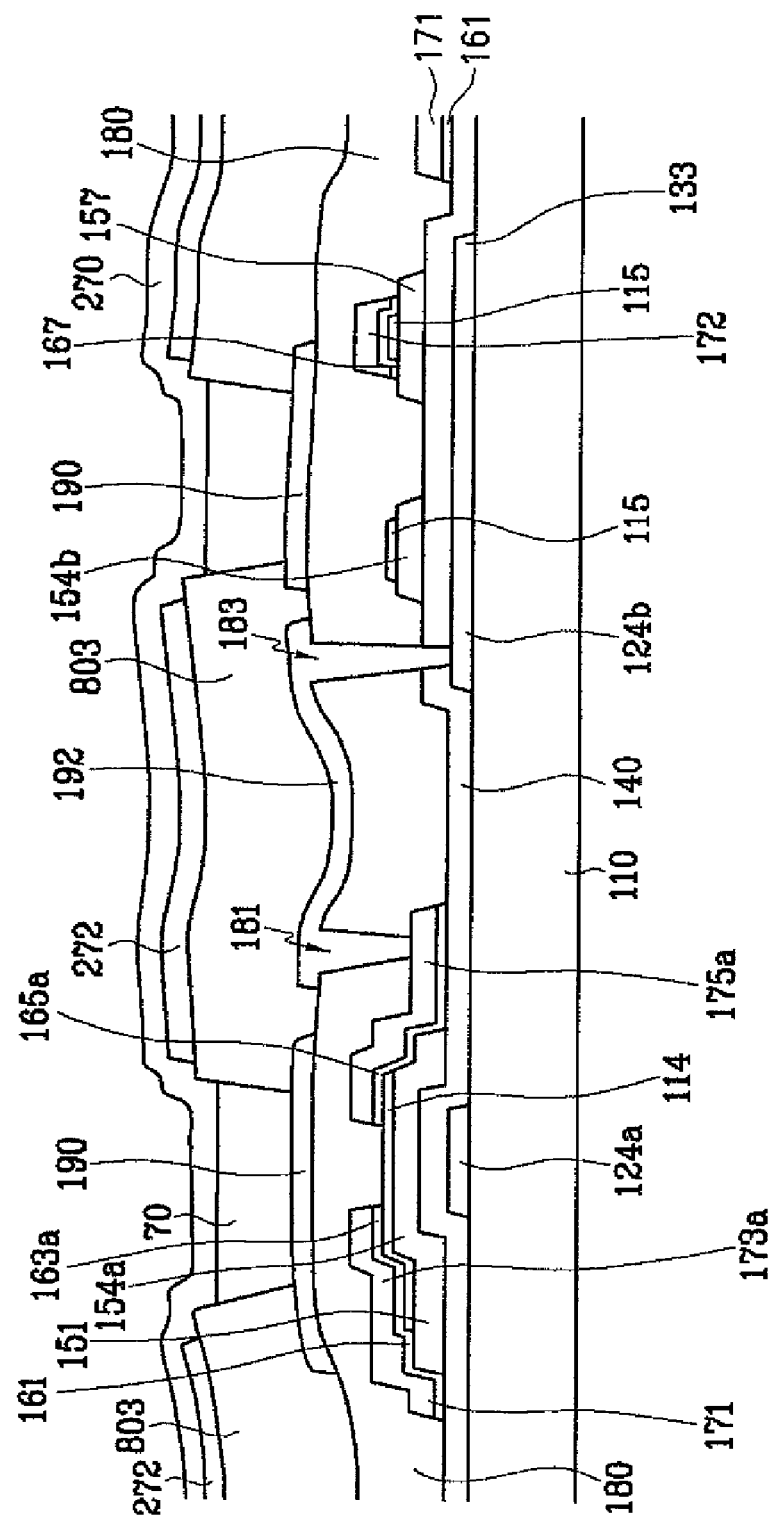
FIG. 9A and FIG. 9B are cross-sectional views of a thin film transistor array panel of FIG. 8 taken along lines IXa-IXa' and IXb-IXb', respectively.
Figure 9B:
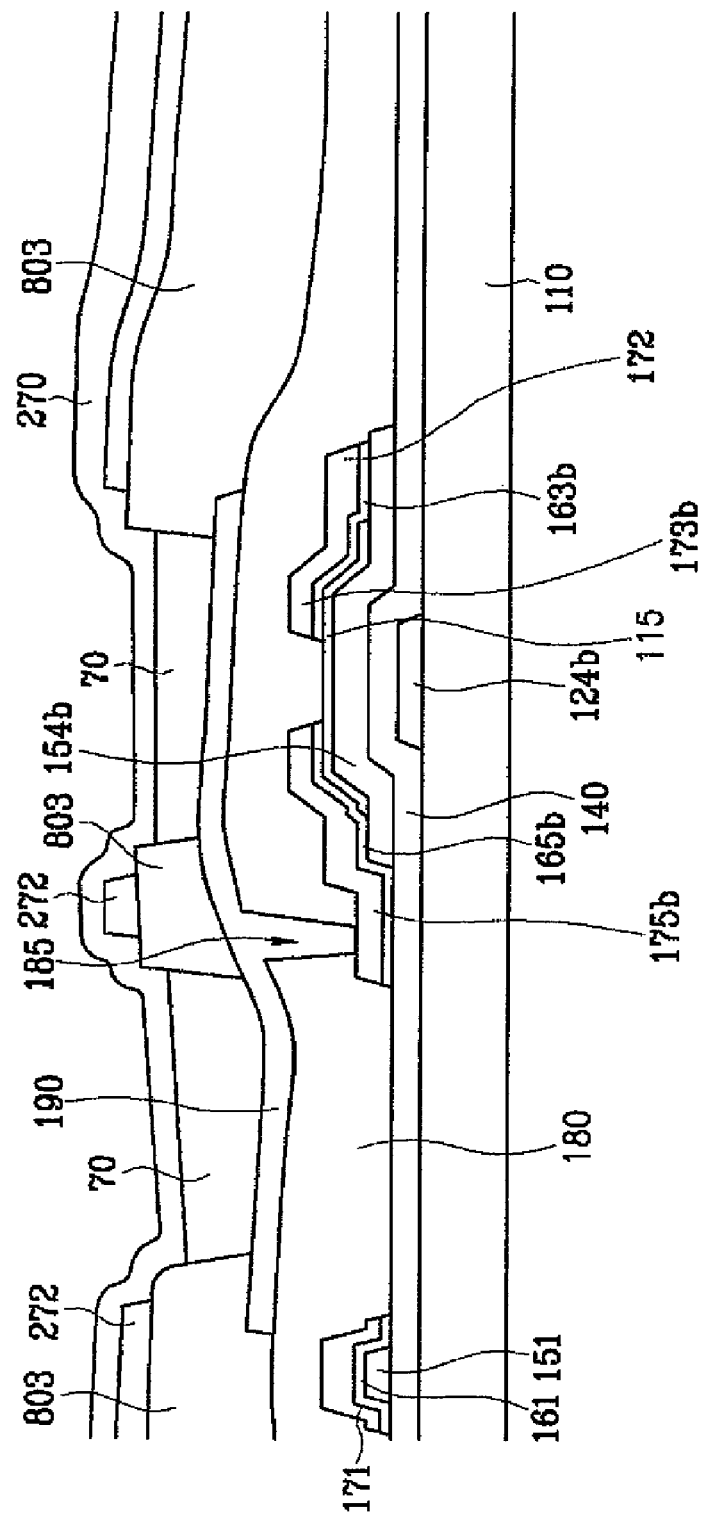

FIG. 8 is a layout view of an organic light-emitting display device according to an exemplary embodiment of the present invention, and FIGS. 9A and 9B are cross-sectional views of a thin film transistor array panel of FIG. 8 taken along lines IXa-IXa' and IXb-IXb', respectively.

A plurality of gate lines 121 that transmit gate signals are formed on an insulation substrate 110 formed of glass. The gate lines 121 extend in the horizontal direction, and parts of each of the gate lines 121 protrude therefrom and form a plurality of first gate electrodes 124a. Second gate electrodes 124b are formed in the same layer as the gate lines 121. Storage electrodes 133 that extend in the vertical direction are respectively connected to the second gate electrodes 124b.

Sides of the gate lines 121 and the storage electrodes 133 are inclined at an angle of about 30 to about 80 degrees with respect to the substrate 110.

A gate insulating layer 140 formed of silicon nitride ($SiN_x$) or the like is formed on the gate lines 121. The gate insulating layer 140 may be formed in a two-layered structure of silicon oxide and silicon nitride.

A plurality of semiconductor stripes 151 and semiconductor islands 154b formed of hydrogenated amorphous silicon or the like are formed on the gate insulating layer 140. The semiconductor stripes 151 extend in the vertical direction, and a plurality of protruding portions 154a protrude from each of the semiconductor stripes 151 toward the first gate electrodes 124a and form first channel portions overlapping the first gate electrode 124a. In addition, each of the semiconductor stripes 151 has a larger width where the semiconductor stripe 151 meets the gate line 121, Each of the semiconductor islands 154b has a second channel portion that intersects the second gate electrode 124b, and a storage electrode portion 157 that overlaps the storage electrode 133.

Etch stop members 114 and 115 formed of silicon nitride ($SiN_x$) or the like are formed on the semiconductor stripe 151 and the semiconductor island 154b. The etch stop members 114 and 115 include a first etch stop member 114 that is formed on the protruding portion 154a of the semiconductor stripe 151 and a second etch stop member 115 that is formed on the semiconductor island 154b. The etch stop members 114 and 115 have a width smaller than that of the protruding portion 154a of the semiconductor stripe 151 and the semiconductor island 154b, respectively. A distance from a side of the protruding portion 154a of the semiconductor stripe 151 to a side of the etch stop member 114 is substantially the same along a perimeter of the etch stop member 114 and a distance from a side of the semiconductor island 154b to a side of the etch stop member 115 is substantially the same along a perimeter of the etch stop member 115.

A plurality of ohmic contact stripes and islands 161, 165a, 163b, 165b and 167 formed of a material such as n+ hydrogenated amorphous silicon in which an n-type impurity is doped at a high concentration are formed on the etch stop members 114 and 115. Each of the ohmic contact stripes 161 has a plurality of protruding portions 163a. Each of the protruding portions 163a and each of the ohmic contact islands 165a are disposed in a pair on the protruding portion 154a of the semiconductor stripe 151. In addition, each of the protruding portions 163b and each of the ohmic contact islands 165b face each other in a pair, centered on the second gate electrode 124b, and are disposed on the semiconductor island 154b. The protruding portion 163a and the ohmic contact island 165a are in contact with the protruding portion 154a of the semiconductor stripe 151 not covered with the first etch stop member 114. The protruding portion 163b and the ohmic contact island 165b are in contact with the semiconductor island 154b not covered with the second etch stop member 115.

A plurality of data lines 171, first drain electrodes 175a, power lines 172, and second drain electrodes 175b are formed on the ohmic contact stripes and islands 161, 165a, 163b, and 165b, respectively.

The data lines 171 and the power lines 172 extend in the vertical direction to intersect the gate lines 121, and transmit a data voltage and a source voltage, respectively. A plurality of branches that extend from each of the data lines 171 toward the first drain electrodes 175a form first source electrodes 173a. In addition, a plurality of branches that extend from each of the power lines 172 toward the second drain electrodes 175b form second source electrodes 173b. A pair of the first and second source electrodes 173a and 173b and a pair of the first and second drain electrodes 175a and 175b are separated from each other and are disposed on opposite sides with respect to the first and second gate electrodes 124a and 124b, respectively.

The planar shapes of the data line 171, the first drain electrode 175a, the power line 172, and the second drain electrode 175b are substantially the same as those of the ohmic contact stripes and islands 161, 165a, 163b, and 165b therebelow. This is because the ohmic contact members 161, 165a, 163b, and 165b, and the data line 171, the first drain electrode 175a, the power line 172, and second drain electrode 175b, are patterned at the same time using a photolithography process.

The first gate electrode 124a, the first source electrode 173a, and the first drain electrode 175a form a switching thin film transistor, together with the protruding portion 154a of the semiconductor stripe 151. In addition, the second gate electrode 124b, the second source electrode 173b, and the second drain electrode 175b form a driving thin film transistor, together with the semiconductor island 154b. At this time, the power line 172 overlaps the storage electrode portion 157 of the semiconductor island 154b.

Sides of the data line 171, the first and second drain electrodes 175a and 175b, and the power line 172 are inclined at an angle of about 30 to about 80 degrees.

The ohmic contact stripes and islands 161, 163b, 165a, and 165b are respectively disposed between the semiconductor stripe 151 and semiconductor island 154b, and the overlying data line 171, first drain electrodes 175a and 175b, and power line 172 to reduce contact resistance.

The first etch stop member 114 has an exposed portion not covered with the data line 171 and the first drain electrode 175a between the first source electrode 173a and first drain electrode 175a, and the second etch stop member 115 has an exposed portion not covered with the power line 172 and the second drain electrode 175b between the second source electrode 173b and the second drain electrode 175b.

A passivation layer 180 formed of an inorganic insulating layer such as silicon nitride, an organic material having an excellent planarization characteristic and photosensitivity, or a low-dielectric constant insulating material such as a-Si:C:O and a-Si:O:F formed by PECVD, is formed on the data line 171, the first and second drain electrodes 175a and 175b, the power line 172, and the exposed portions of the semiconductor stripe 151 and semiconductor island 154b.

A plurality of contact holes 181, 185, and 182, which expose the first drain electrode 175a, the second drain electrode 175b, and an end 179 of the data line 171, respectively, are formed in the passivation layer 180. In addition, a plurality of contact holes 183 and 189, which expose the second gate electrode 124b and an end 129 of the gate line 121, respectively, are formed in the passivation layer 180 and gate insulating layer 140.

A plurality of pixel electrodes 190, connecting members 192, and contact assistants 81 and 82, all of which are formed of ITO or IZO, are formed on the passivation layer 180.

The pixel electrode 190 is physically and electrically connected to the second drain electrode 175b through the contact hole 185, and the connecting member 192 connects the first drain electrode 175a and the second gate electrode 124b through the contact holes 181 and 183. The contact assistants 81 and 82 are connected to the ends 129 and 179 of the gate line 121 and the data line 171 through the contact holes 189 and 182, respectively.

Partition walls 803 formed of an organic or inorganic insulating material are formed on the passivation layer 180 to separate organic light emission cells from one another. Each of the partition walls 803 surrounds the edges of the pixel electrode 190 and defines a region to be filled with an organic light emission layer 70.

The light emission layer 70 is formed on the region surrounded by the partition wall 803 on the pixel electrode 190. The light emission layer 70 is formed of an organic material emitting one of red (R), green (G), and blue (B) colors. The light emitting materials for the red (R), green (G), and blue (B) colors are sequentially and repeatedly disposed.

Alternatively, the light emission layer 70 may be formed on a hole injection layer (not shown) after the hole injection layer is formed in a region on the pixel electrode 190 surrounded by the partition wall 803. The hole injection layer may be formed of poly(3,4-ethylenedioxythiophene)-poly(styrenesulfonic acid) (PEDOT/PSS).

An auxiliary electrode 272, which has the same pattern as the partition wall 803 and is formed of a conductive material having low resistivity, is formed on the partition wall 803. The auxiliary electrode 272 is in contact with a common electrode 270 to be formed later, and reduces resistance of the common electrode 270.

The common electrode 270 is formed on the partition wall 803, the light emission layer 70, and the auxiliary electrode 272. The common electrode 270 is formed of a metal, such as aluminum (Al), having low resistance. A bottom emission type organic light-emitting display device has been described in accordance with an exemplary embodiment of the present invention. However, in a front emission type or a both-side emission type organic light-emitting display device, the common electrode 270 may be formed of a transparent conductive material, such as ITO or IZO.

A method of manufacturing the organic light-emitting display device shown in FIGS. 8 to 9B will be described in detail with reference to FIGS. 10 to 17B.

Figure 10:
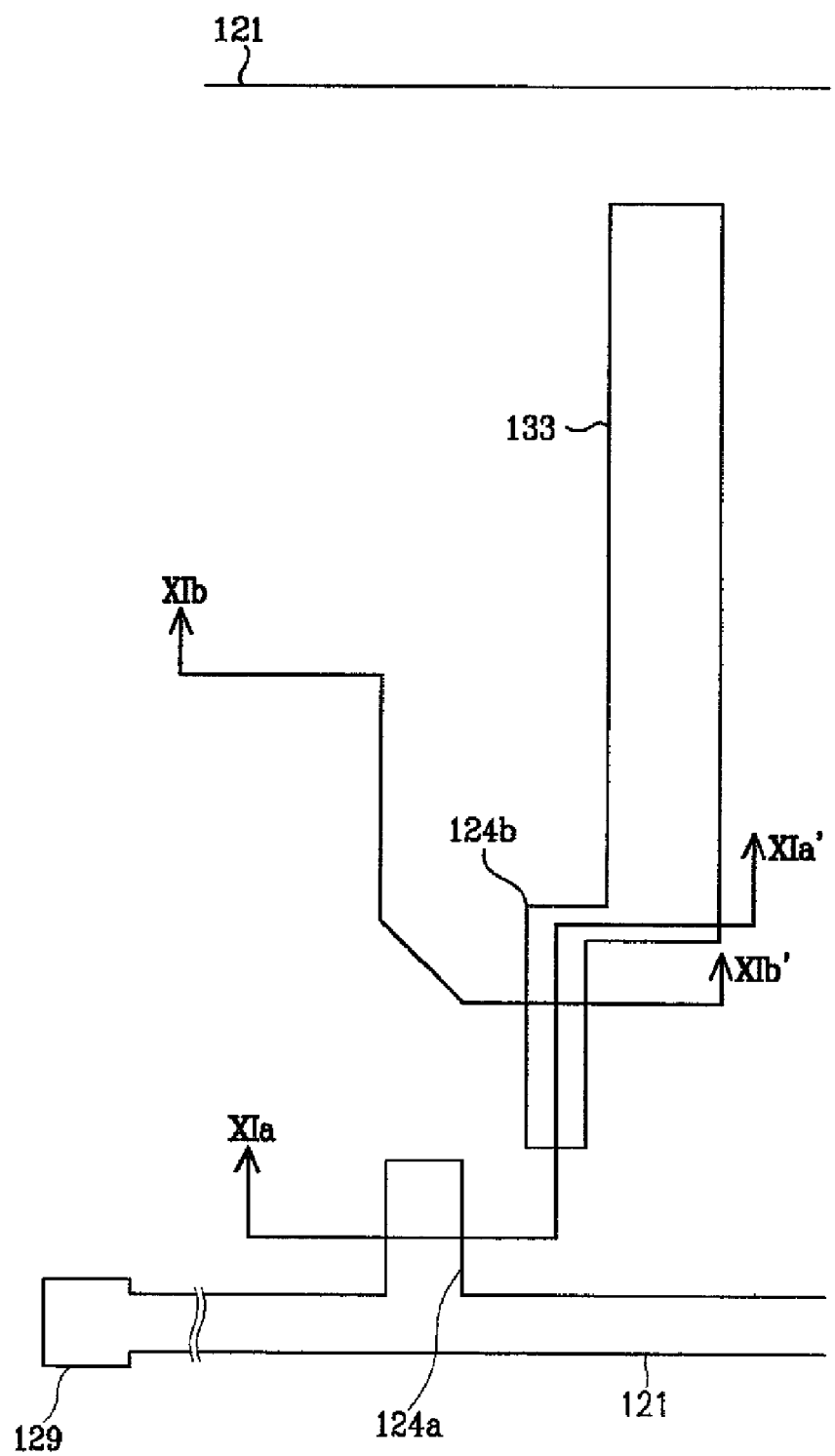
FIG. 10, FIG. 12, FIG. 14, and FIG. 16 are layout views of the organic light-emitting display device of FIG. 8 during a manufacturing process thereof according to an exemplary embodiment of the present invention.
Figure 11A:
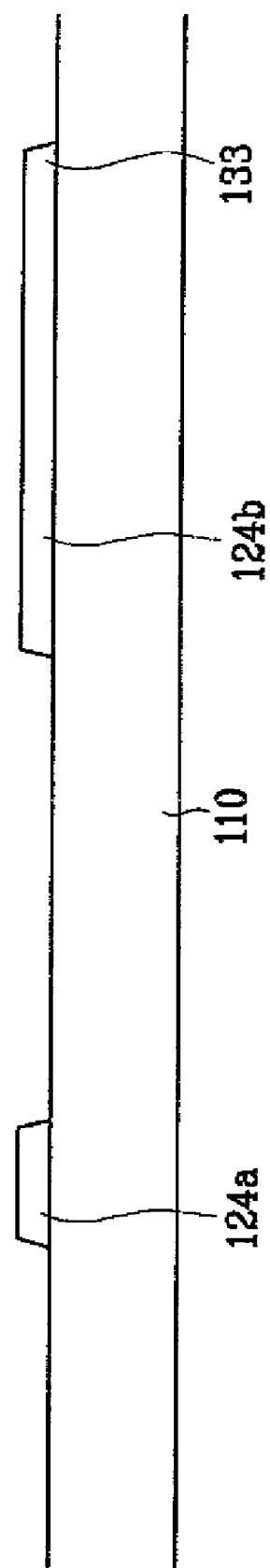
FIG. 11A is a cross-sectional view taken along line XIa-XIa' of FIG. 10.
Figure 11B:
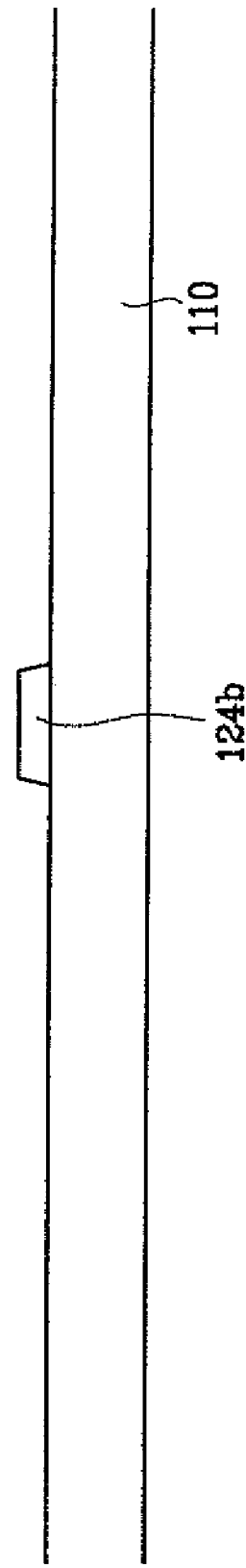
FIG. 11B is a cross-sectional view taken along line XIb-XIb' of FIG. 10.
Figure 12:
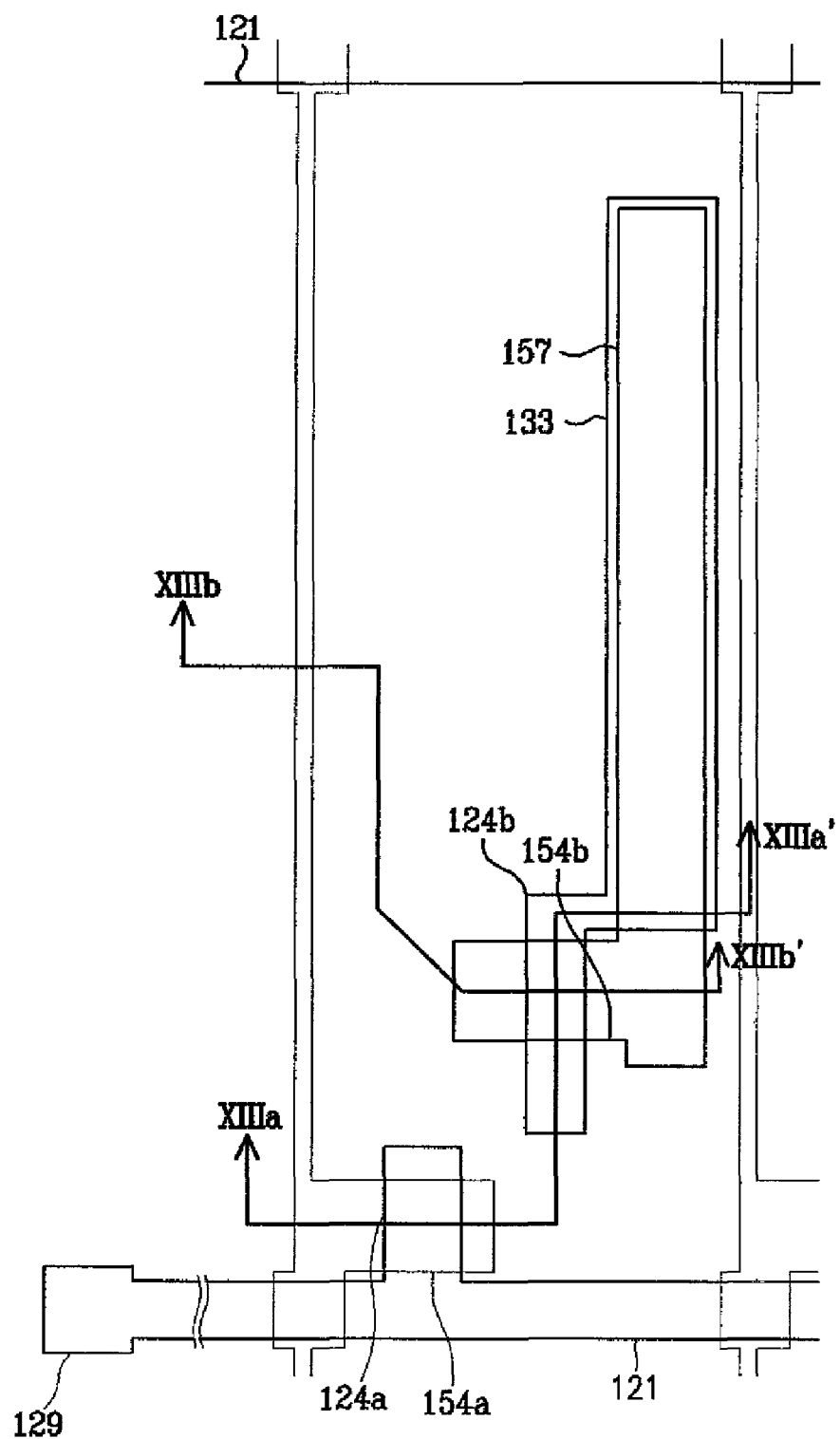
Figure 13A:
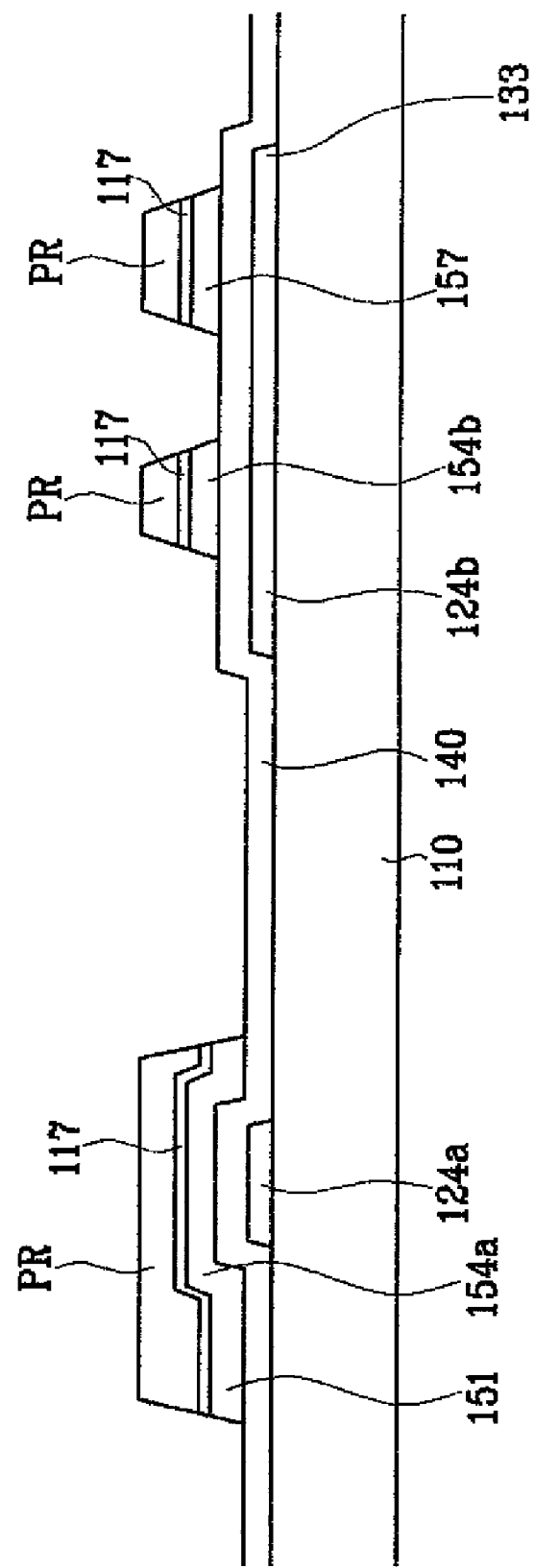
FIG. 13A is a cross-sectional view taken along line XIIIa-XIIIa' of FIG. 12.
Figure 13B:
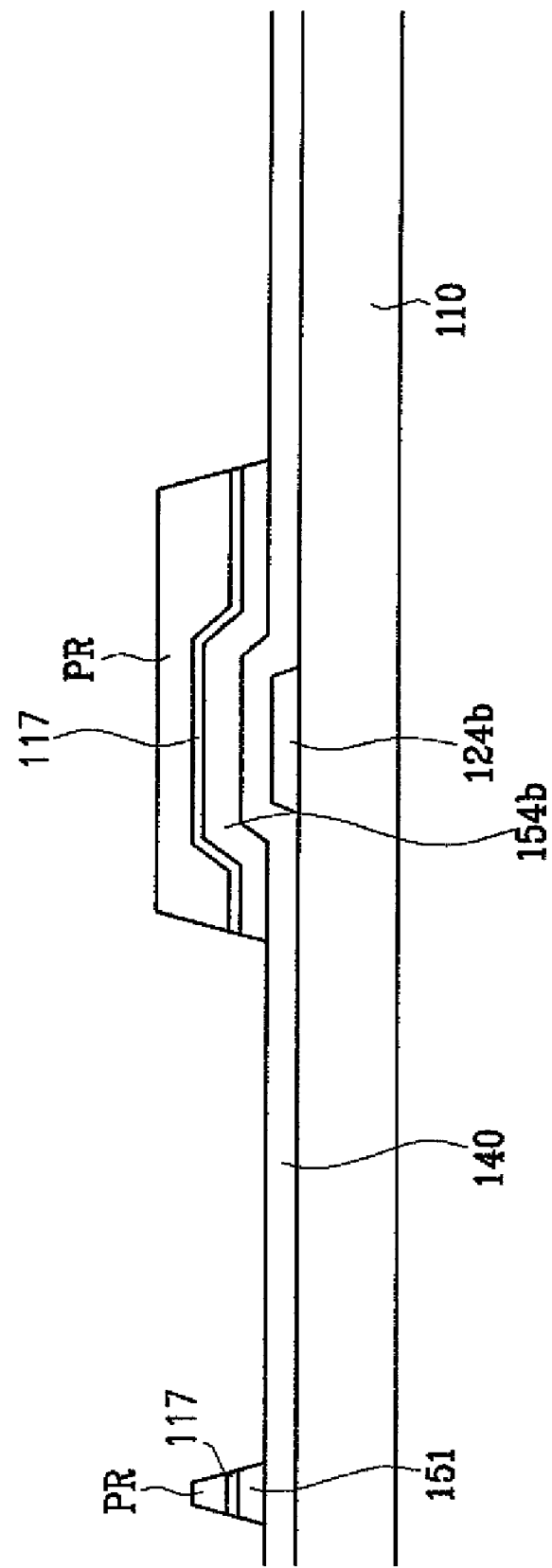
FIG. 13B is a cross-sectional view taken along line XIIIb-XIIIb' of FIG. 12.
Figure 14:
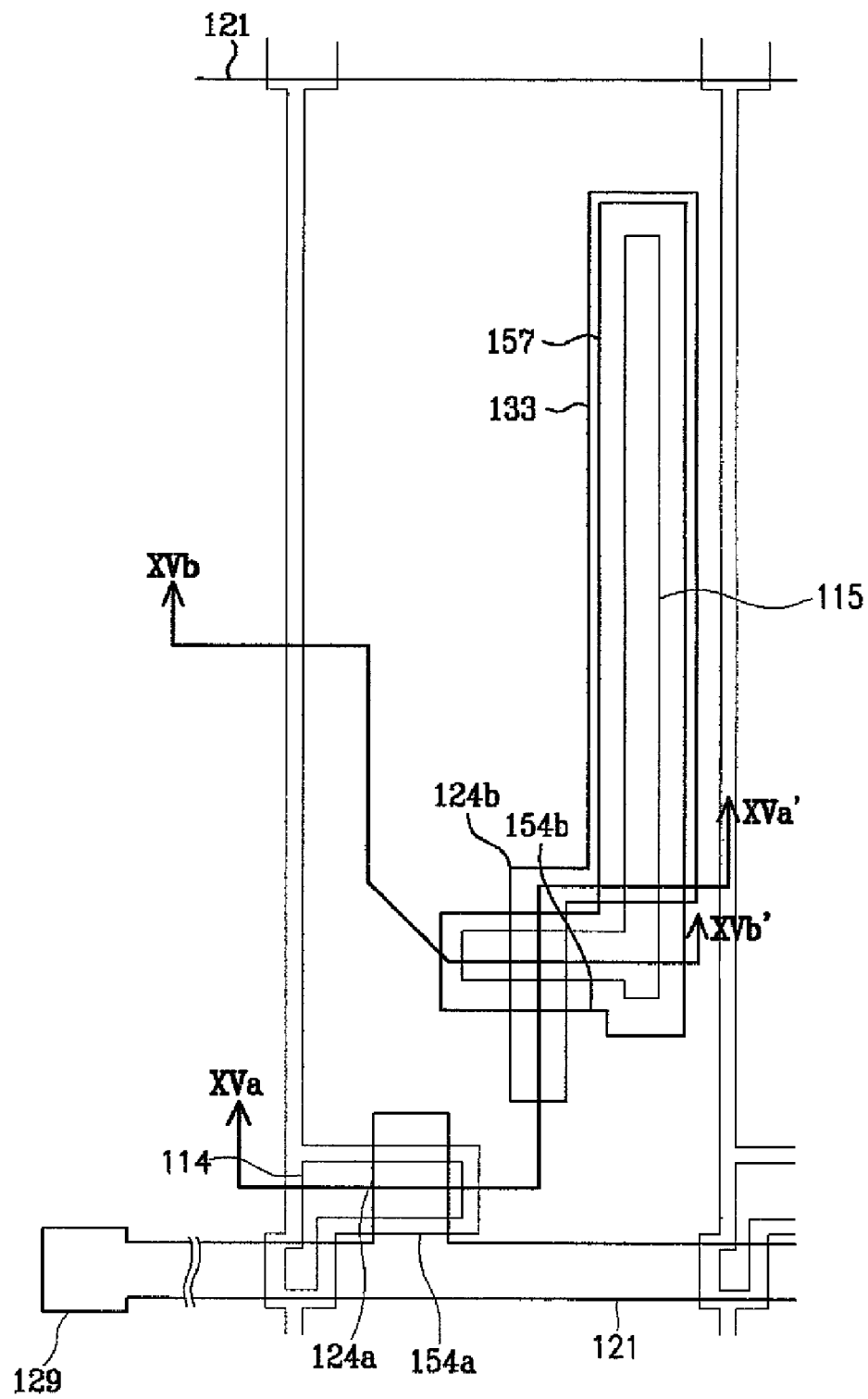
Figure 15A:
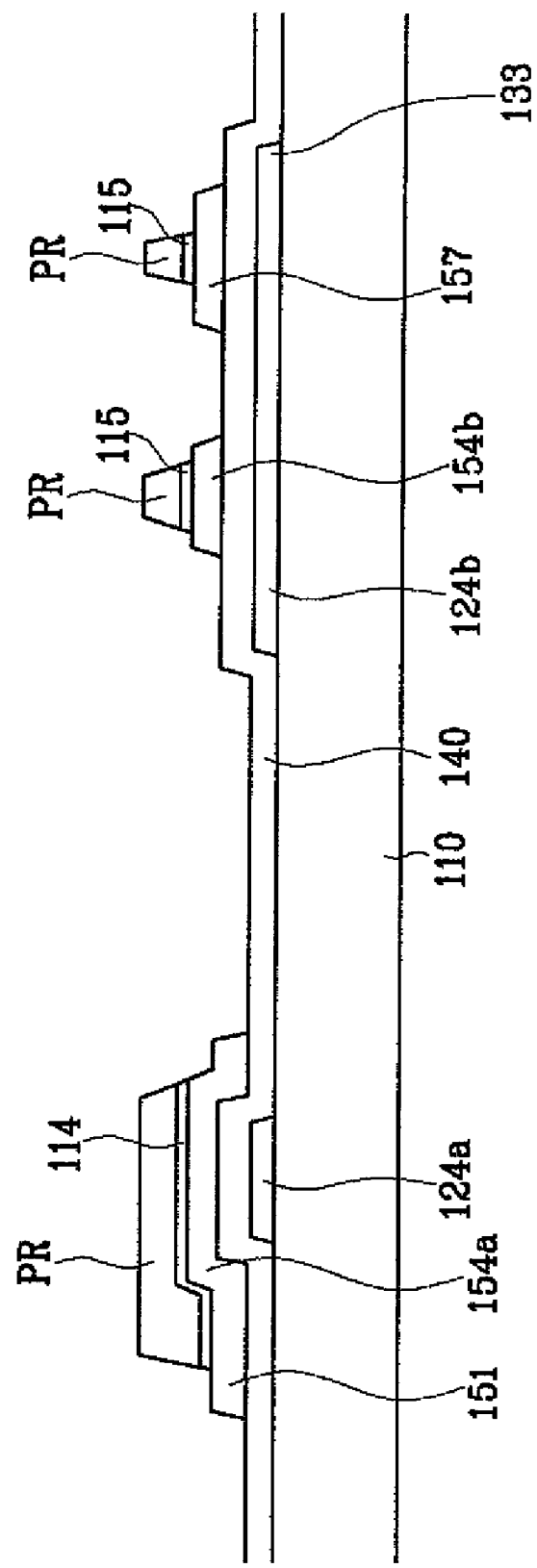
FIG. 15A is a cross-sectional view taken along line XVa-XVa' of FIG. 14.
Figure 15B:
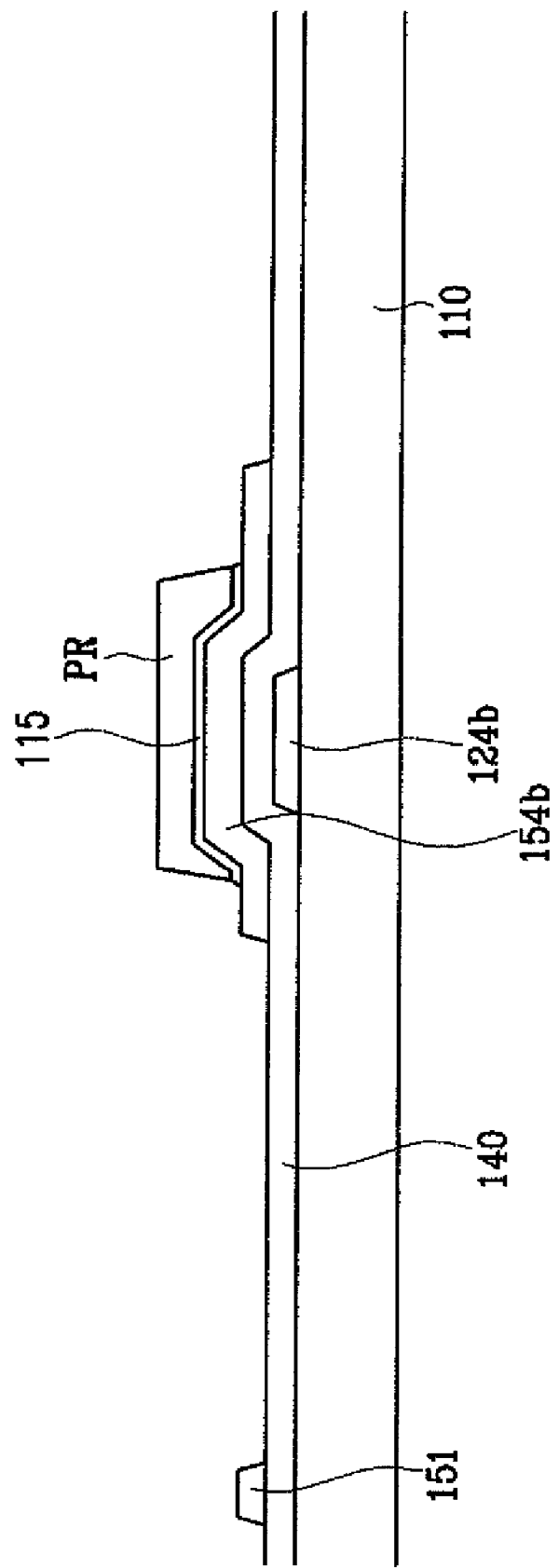
FIG. 15B is a cross-sectional view taken along line XVb-XVb' of FIG. 14.
Figure 16:
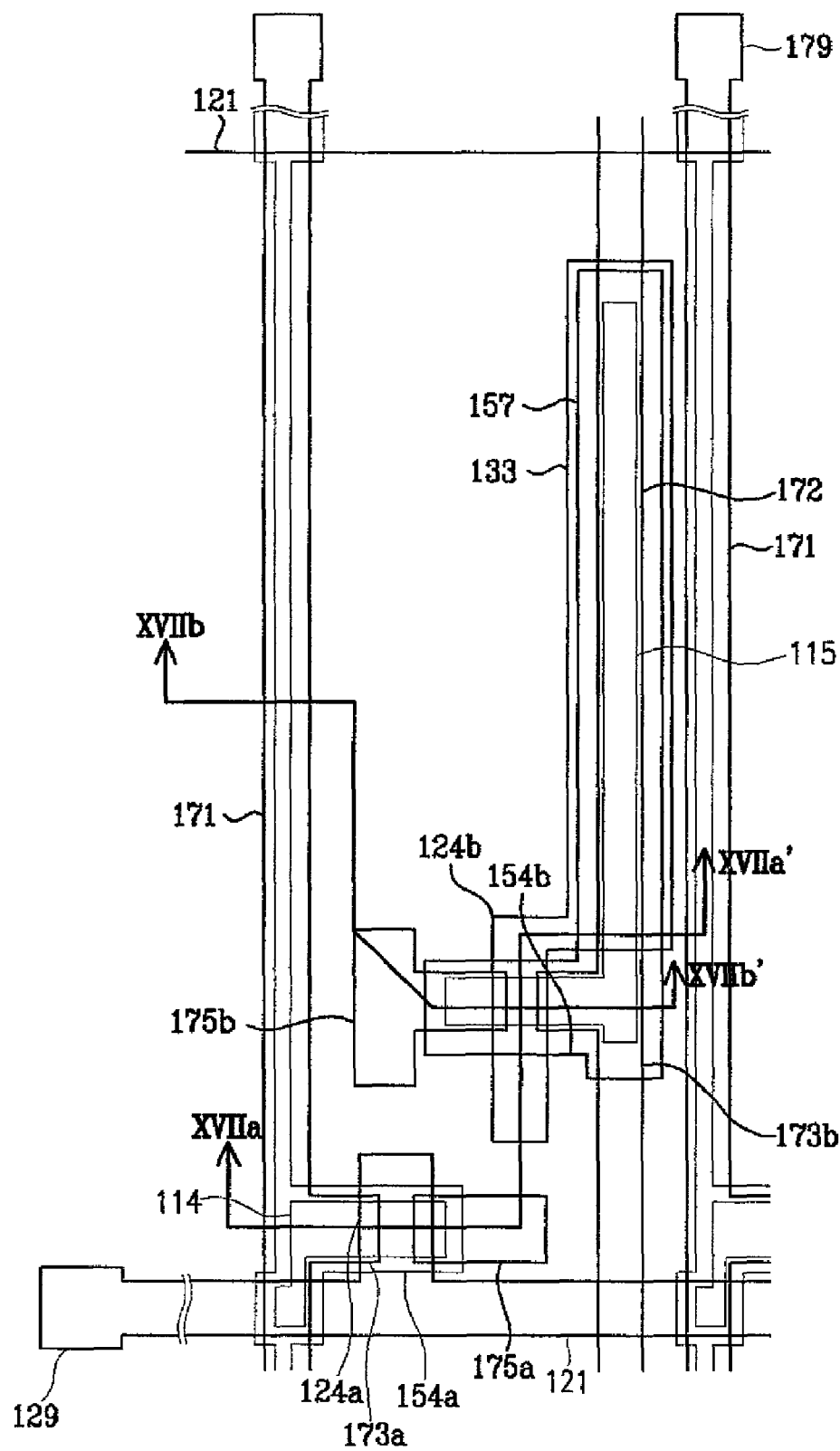
Figure 17A:
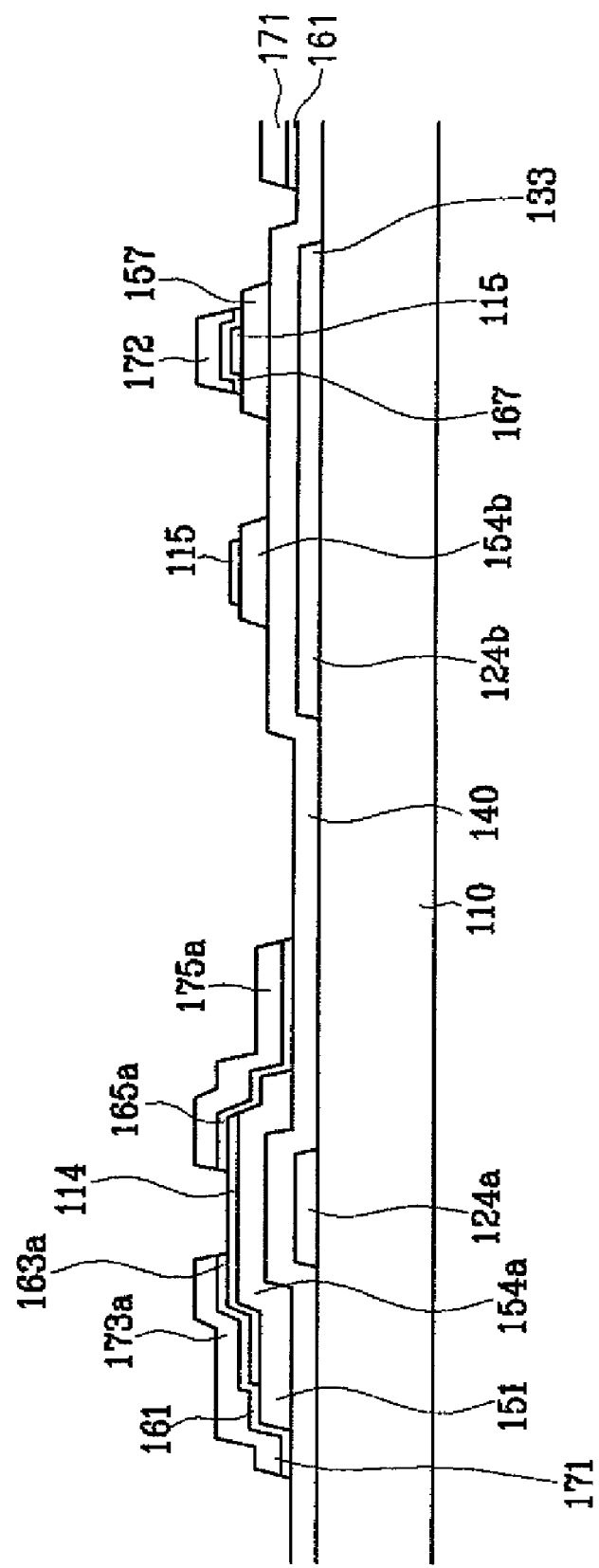
FIG. 17A is a cross-sectional view taken along line XVIIa-XVIIa' of FIG. 16.
Figure 17B:
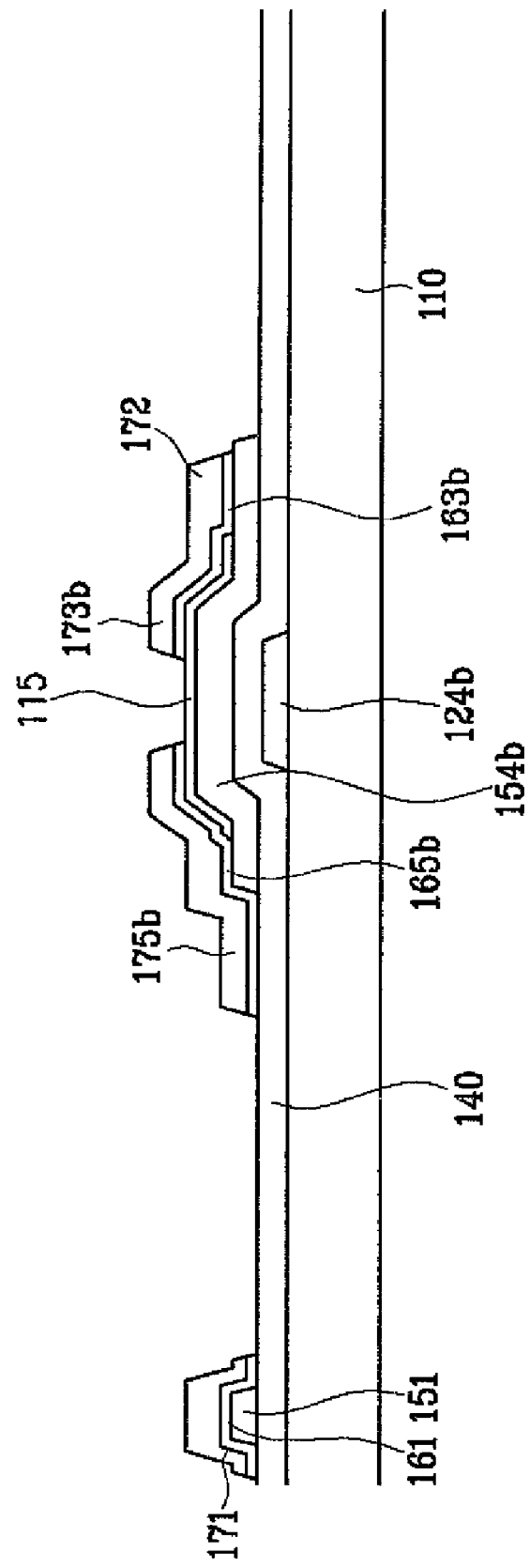
FIG. 17B is a cross-sectional view taken along line XVIIb-XVIIb' of FIG. 16.

FIG. 10, FIG. 12, FIG. 14, and FIG. 16 are layout views of the organic light-emitting display device of FIG. 8 during a manufacturing process thereof according to an exemplary embodiment of the present invention. FIG. 11A is a cross-sectional view taken along line XIa-XIa' of FIG. 10, FIG. 11B is a cross-sectional view taken along line XIb-XIb' of FIG. 10, FIG. 13A is a cross-sectional view taken along line XIIIa-XIIIa' of FIG. 12, FIG. 13B is a cross-sectional view taken along line XIIIb-XIIIb' of FIG. 12, FIG. 15A is a cross-sectional view taken along line XVa-XVa' of FIG. 14, FIG. 15B is a cross-sectional view taken along line XVb-XVb' of FIG. 14, FIG. 17A is a cross-sectional view taken along line XVIIa-XVIIa' of FIG. 16, and FIG. 17B is a cross-sectional view taken along line XVIIb-XVIIb' of FIG. 16.

As shown in FIGS. 10 to 11B, a gate metal layer formed of aluminum (Al) or an aluminum alloy is deposited on the insulation substrate 110 formed of transparent glass or plastic. The gate lines 121 having the first gate electrodes 124a, second gate electrodes 124b, and storage electrodes 133 are formed by etching the gate metal layer using photolithography. The gate line 121, the second gate electrode 124b, and the storage electrode 133 may be formed in a two-layered structure of chromium and aluminum. In this case, the chromium and aluminum layers may have thicknesses of about 500 Å and about 2500 Å, respectively.

As shown in FIGS. 12 to 13B, the gate insulating layer 140 is formed by depositing silicon nitride ($SiN_x$) or silicon oxide ($SiO_2$). An intrinsic amorphous silicon layer and an etch stop layer formed of silicon nitride are successively deposited. The semiconductor stripes 151 and semiconductor islands 154b, which have a plurality of pre-patterns 117 of the etch stop members 114 and 115 and protruding portions 154a, respectively, are formed by etching the etch stop layer and the intrinsic amorphous silicon layer using photolithography. The gate insulating layer 140 may be formed of silicon nitride ($SiN_x$), and a deposition temperature may be about 250 to about 500° C. Moreover, the thickness thereof may be about 2000 to about 5000 Å. Reference symbol PR in FIGS. 13A and 13B denotes a photoresist film used in the photolithography.

As shown in FIGS. 14 to 15B, if a portion of the photoresist film PR is removed by ashing, the photoresist film PR is reduced in thickness and width, and thus, the pre-pattern 117 of etch stop members 114 and 115 is partially exposed. The etch stop members 114 and 115 are completed by etching the exposed pre-pattern 117. The photoresist film PR is removed.

As shown in FIGS. 16 to 17B, an ohmic contact layer is formed by depositing a material such as n+ hydrogenated amorphous silicon, in which an n-type impurity is doped at a high concentration, on the etch stop members 114 and 115. In addition, a data metal layer formed of a refractory metal such as molybdenum, chromium, tantalum, or titanium, or an alloy thereof, is deposited on the ohmic contact layer. Here, the ohmic contact layer and the data metal layer may have thicknesses of about 500 Å and about 1500 Å, respectively. Ohmic contact stripes and islands 161, 165a, 163b, 165b, and 167, data lines 171, a plurality of the first drain electrodes 175a, a plurality of the power lines 172, and the second drain electrodes 175b are formed by etching the data metal layer and the ohmic contact layer at the same time using photolithography.

As shown in FIGS. 8 to 9B, the passivation layer 180 is formed by coating an organic or inorganic insulating material. A plurality of the contact holes 181, 185, 183, 189, and 182 are formed by etching the passivation layer 180 and gate insulating layer 140 using photolithography. The contact holes 181, 185, 183, 189, and 182 expose portions of the first and second drain electrodes 175a and 175b and the second gate electrode 124b, and the ends 129 and 179 of the gate line 121 and the data line 171, respectively.

The pixel electrode 190, connecting member 192, and contact assistants 81 and 82 are formed of ITO or IZO.

The partition wall 803 and auxiliary electrode 272 are formed using a photolithography process with one mask.

The hole injection layer (not shown) formed of poly (3,4-ethylenedioxythiophene)-poly(styrenesulfonic acid) (PE-DOT/PSS) is formed on the pixel electrode 190 surrounded by the partition wall 803 using spin coating or printing.

The light emission layer 70 is formed on the hole injection layer (not shown).

The common electrode 270 is formed on the light emission layer 70.

The etch stopper type thin film transistor formed according to exemplary embodiments of the present invention has an excellent stability characteristic as compared with an etch back type thin film transistor. This is because, when forming the etch back type thin film transistor, the amorphous silicon layer of the channel portion is partially etched and may become damaged by an etching plasma during the etching process of the ohmic contact layer, whereas when forming the thin film transistor according to an exemplary embodiment of the present invention, the etch stop member covers the amorphous silicon layer of the channel portion when the data metal layer and ohmic contact layer are etched. As a result, charge mobility of the thin film transistor according to an exemplary embodiment of the present invention is about 0.8 V/cm$^2$sec, which is higher than the charge mobility of about 0.3 V/cm$^2$sec for the etch back type thin film transistor.

According to an exemplary embodiment of the present invention, a process of forming an etch stopper type thin film transistor can be simplified by forming the etch stop members using the photoresist film used in the patterning of the amorphous silicon layer and by simultaneously etching and patterning the ohmic contact layer and the data wire layer, thereby reducing the number of photolithography processes used to form the etch stopper type thin film transistor.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, comprising:
    forming gate lines including gate electrodes on an insulation substrate;
    forming a gate insulating layer, a semiconductor layer, and an etch stop layer on the gate lines;
    patterning the etch stop layer and the semiconductor layer at the same time using photolithography;
    partially removing a photoresist film pattern used in the patterning of the etch stop layer and the semiconductor layer;
    removing the etch stop layer exposed by removed portions of the photoresist film pattern to form etch stop members;
    depositing an ohmic contact layer and a data metal layer onto the etch stop members;
    etching the ohmic contact layer and the data metal layer at the same time using photolithography to form data lines having source electrodes, drain electrodes facing the source electrodes, and ohmic contact members below the source electrodes and the drain electrodes;
    forming a passivation layer on the data lines and the drain electrodes; and
    forming pixel electrodes on the passivation layer.

2. The method of claim 1, wherein each of the ohmic contact members has substantially the same planar pattern as that of a data line and drain electrode formed thereon.

3. The method of claim 1, wherein the gate insulating layer, semiconductor layer, and etch stop layer are sequentially formed on the gate lines.

4. A method of manufacturing a thin film transistor array panel, comprising:
    forming gate lines having first gate electrodes, second gate electrodes, and storage electrodes on an insulation substrate;
    forming a gate insulating layer, a semiconductor layer, and an etch stop layer on the gate lines, the second gate electrodes, and the storage electrodes;
    patterning the etch stop layer and the semiconductor layer at the same time using photolithography;
    partially removing a photoresist film pattern used in the patterning of the etch stop layer and the semiconductor layer;
    removing the etch stop layer exposed by removed portions of the photoresist film pattern to form first and second etch stop members;
    depositing an ohmic contact layer and a data metal layer onto the first and second etch stop members;
    etching the ohmic contact layer and data metal layer at the same time using photolithography to form data lines having first source electrodes, first drain electrodes facing the first source electrodes, power lines having second source electrodes, second drain electrodes facing the second source electrodes, and ohmic contact members below the first and second drain electrodes;
    forming a passivation layer on the data lines, the first drain electrodes, the power lines, and the second drain electrodes; and forming pixel electrodes that are connected to the second drain electrodes and connecting members that electrically connect the first drain electrodes and second gate electrodes to each other.

5. The method of claim 4, wherein each of the ohmic contact members has substantially the same planar pattern as that of a data line, first drain electrode, power line, and second drain electrode formed thereon.

6. The method of claim 4, further comprising:
forming partition walls on the pixel electrodes;
forming an organic light emission layer that fills frames defined by the partition walls; and
forming a common electrode on the organic light emission layer.

7. The method of claim 4, wherein the gate insulating layer, semiconductor layer, and etch stop layer are sequentially formed on the gate lines, the second gate electrodes, and the storage electrodes.

8. A method of manufacturing a thin film transistor array panel, comprising:
forming a gate line including a gate electrode on an insulation substrate;
forming a gate insulating layer, a semiconductor layer, an etch stop layer, and a photoresist layer on the gate lines;
forming a photoresist pattern by exposing the photoresist layer to a light and developing the photoresist layer so that a first portion of the etch stop layer is exposed;
removing the first portion of the etch stop layer to expose a portion of the semiconductor layer;
removing the exposed portion of the semiconductor layer to form a semiconductor pattern;
removing a portion of the photoresist pattern to expose a second portion of the etch stop layer;
removing the second portion of the etch stop layer to form an etch stop member;
depositing an ohmic contact layer and a data metal layer onto the etch stop member;
patterning the ohmic contact layer and the data metal layer to form an ohmic contact pattern, a data line having a source electrode, and a drain electrode facing the source electrode.

9. The method of claim 8, wherein the ohmic contact pattern has substantially the same planar pattern as that of the data line and the drain electrode formed thereon.

10. The method of claim 9, wherein the gate insulating layer, semiconductor layer, and etch stop layer are sequentially formed on the gate line.

11. The method of claim 10, wherein the etch stop member and the semiconductor pattern are formed with one photolithography process.

12. The method of claim 11, wherein the ohmic contact pattern, the data line and the drain electrode are formed with one photolithography process.

13. The method of claim 8, wherein the gate insulating layer, semiconductor layer, and etch stop layer are sequentially formed on the gate line.

14. The method of claim 13, wherein the etch stop member and the semiconductor pattern are formed with one photolithography process.

15. The method of claim 14, wherein the ohmic contact pattern, the data line and the drain electrode are formed with one photolithography process.

16. The method of claim 8, wherein the etch stop member and the semiconductor pattern are formed with one photolithography process.

17. The method of claim 16, wherein the ohmic contact pattern, the data line and the drain electrode are formed with one photolithography process.

18. The method of claim 8, wherein the ohmic contact pattern, the data line and the drain electrode are formed with one photolithography process.

* * * * *